(12) United States Patent
Klein

(10) Patent No.: US 10,536,760 B2
(45) Date of Patent: Jan. 14, 2020

(54) MICROELECTROMECHANICAL SYSTEM

(71) Applicant: Infineon Technologies AG, Neubiberg (DE)

(72) Inventor: Wolfgang Klein, Zorneding (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 16/241,340

(22) Filed: Jan. 7, 2019

(65) Prior Publication Data

US 2019/0215587 A1 Jul. 11, 2019

(30) Foreign Application Priority Data

Jan. 8, 2018 (DE) .................. 10 2018 200 190

(51) Int. Cl.
| H04R 1/02 | (2006.01) |
| B81B 7/00 | (2006.01) |
| H04R 19/00 | (2006.01) |
| H04R 19/02 | (2006.01) |
| H04R 19/04 | (2006.01) |

(52) U.S. Cl.
CPC .......... H04R 1/023 (2013.01); B81B 7/0061 (2013.01); H04R 19/005 (2013.01); H04R 19/02 (2013.01); H04R 19/04 (2013.01); *B81B 2201/0257* (2013.01); *H04R 2201/003* (2013.01)

(58) Field of Classification Search
CPC ...... H04R 1/023; H04R 19/005; H04R 19/02; H04R 19/04; H04R 2201/003; B81B 7/0061; B81B 2201/0257

USPC .......................................................... 381/361
See application file for complete search history.

(56) References Cited

U.S. PATENT DOCUMENTS

| 2006/0233401 A1* | 10/2006 | Wang .................... B81B 3/0072 381/176 |
| 2012/0237073 A1* | 9/2012 | Goida ...................... H04R 1/02 381/361 |
| 2014/0044297 A1* | 2/2014 | Loeppert .................. H04R 1/04 381/355 |
| 2014/0064542 A1* | 3/2014 | Bright .................... H04R 1/086 381/359 |
| 2014/0169607 A1* | 6/2014 | Goida .................... H04R 1/021 381/365 |
| 2014/0294226 A1* | 10/2014 | Suvanto .................. H04R 1/04 381/398 |

(Continued)

FOREIGN PATENT DOCUMENTS

| DE | 102016109101 A1 | 11/2016 |
| EP | 2566183 A1 | 3/2013 |
| JP | 2008271426 A | 11/2008 |

*Primary Examiner* — Sean H Nguyen
(74) *Attorney, Agent, or Firm* — Slater Matsil, LLP

(57) ABSTRACT

A microelectromechanical system includes a housing with an access opening and a sound transducer with a membrane and a backplate, wherein the sound transducer is coupled to the access opening. The microelectromechanical system includes a filter arranged between the access opening and the sound transducer and includes a filter material and a pretension element, the pretension element being mechanically connected to the filter material, and wherein the pretension element produces stress in the filter material in order to provide a bending deformation of the filter in a direction away from the backplate.

23 Claims, 16 Drawing Sheets

(56) References Cited

U.S. PATENT DOCUMENTS

2014/0341420 A1* 11/2014 Karkkainen ......... H04R 1/2842
    381/387
2016/0345084 A1   11/2016 Friza et al.
2017/0280218 A1*  9/2017 Wang .................. H04R 19/016
2018/0206042 A1*  7/2018 Kursula ................ H04R 19/04

* cited by examiner

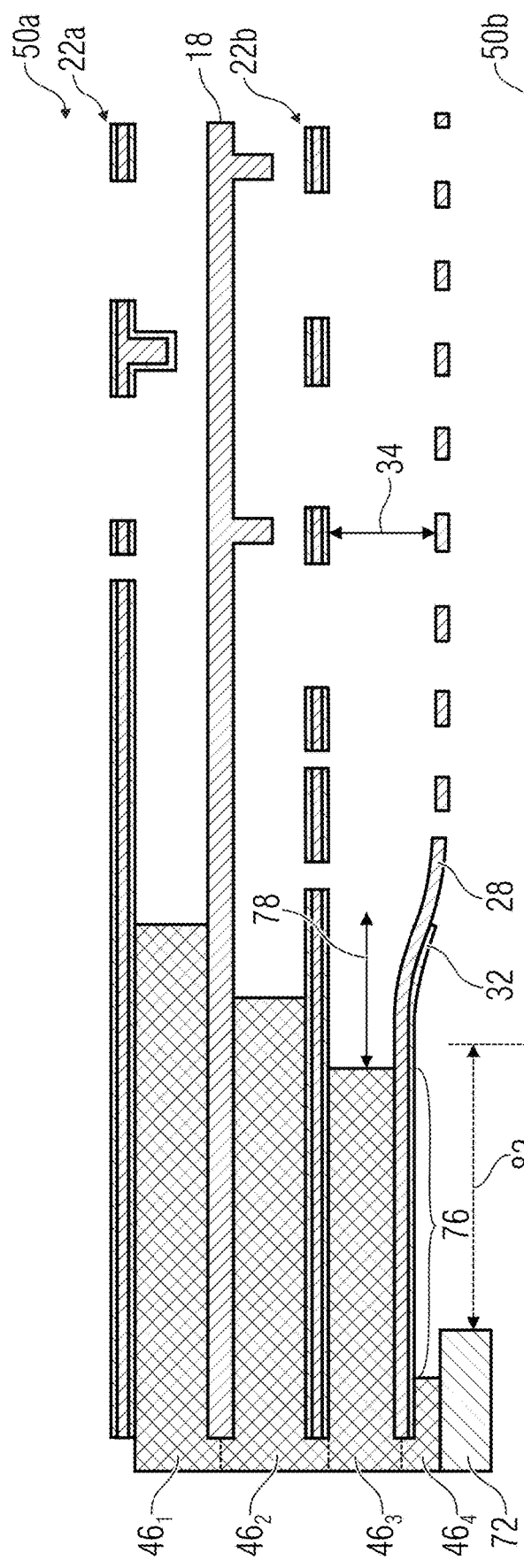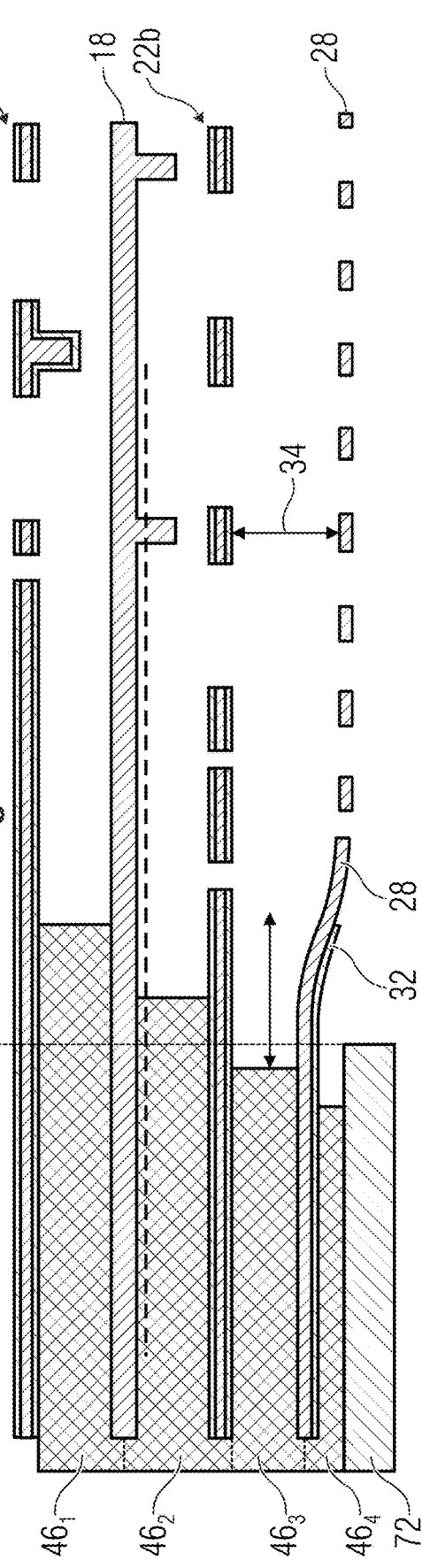

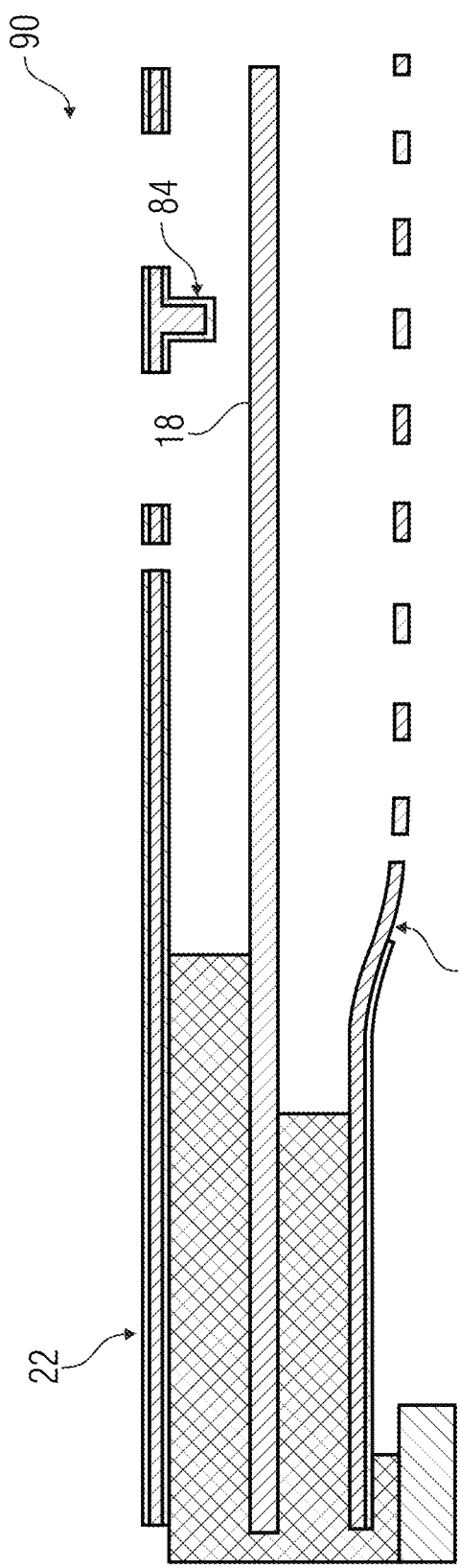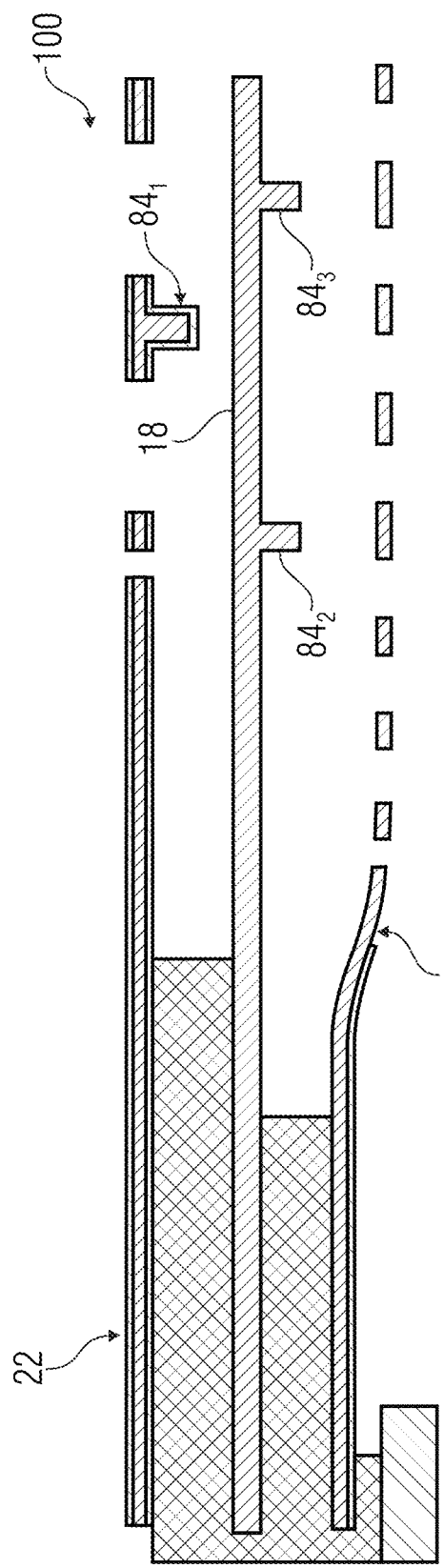

MICROELECTROMECHANICAL SYSTEM

This application claims the benefit of German Patent Application No. 102018200190.1, filed on Jan. 8, 2018, which application is hereby incorporated herein by reference.

TECHNICAL FIELD

The present disclosure relates to a microelectromechanical system, in particular a microelectromechanical system with a sound transducer structure. Further, the present disclosure relates to a MEMS with an integrated filter structure.

BACKGROUND

Microelectromechanical systems (MEMSs) may be manufactured using semiconductor technology and/or may comprise semiconductor materials. These include, for example, layers or wafers comprising a silicon material, a gallium arsenide material and/or another semiconductor material. MEMS structures may have layer sequences that comprise electrically conducting, electrically semiconducting and/or electrically poorly conducting or insulating layers in order to provide a corresponding MEMS functionality. Some MEMS structures may have sound transducer structures, which may comprise a deflectable or movable membrane, for example. The membrane can be deflected on the basis of an electric signal in order to provide an acoustic signal. Alternatively, or additionally, a deflection of the membrane can be brought about on the basis of an acoustic signal, whereupon electric signal is providable. MEMS with a reliably operable sound transducer structure would be desirable.

SUMMARY

Exemplary embodiments develop a microelectromechanical system with a housing which has an access opening. Further, the microelectromechanical system comprises a sound transducer structure with a membrane structure and a backplate structure. The sound transducer structure is coupled, for example acoustically coupled, to the access opening. The microelectromechanical system comprises a filter structure which is arranged between the access opening and the sound transducer structure and which comprises a filter material and at least one pretension element, the latter being mechanically connected to the filter material, wherein the at least one pretension element is embodied to produce stress in the filter material in order to provide a bending deformation of the filter structure in a direction away from the backplate structure. The filter structure facilitates keeping water, foreign bodies and/or particles out, and so these only emerge from the access opening in small quantities or do not reach the sound transducer structure at all, while the spacing of the filter structure by means of the pretension element facilitates obtaining low acoustic damping, and so, overall, a reliable operation of the sound transducer structure can be obtained.

BRIEF DESCRIPTION OF THE DRAWINGS

Exemplary embodiments are explained below with reference to the attached drawings. In detail:

FIG. 3a shows a schematic side sectional view of a MEMS according to one exemplary embodiment, which has a modified sound transducer structure in comparison with the MEMS of FIG. 2a;

FIGS. 7a-7b show schematic side sectional views of MEMSs according to exemplary embodiments, in which an etching process has yielded different results, according to exemplary embodiments;

FIG. 10 shows a schematic side sectional view of part of a MEMS according to one exemplary embodiment, which is formed as a single backplate configuration;

FIG. 11 shows a schematic side sectional view of part of a MEMS according to one exemplary embodiment, which, in contrast to the MEMS of Figure to, has anti-sticking elements on the membrane structure;

DETAILED DESCRIPTION OF ILLUSTRATIVE EMBODIMENTS

Before exemplary embodiments are explained more closely below, in detail on the basis of the drawings, reference is made to the fact that identical or functionally equivalent elements, objects and/or structures, or elements, objects and/or structures that have the same effect, are provided with the same reference signs in the various figures, and so the descriptions of these elements, presented in the various exemplary embodiments, are interchangeable among one another or can be applied to one another.

The following exemplary embodiments relate to microelectromechanical systems or structures (MEMS), which comprise a sound transducer structure. By way of example, MEMS sound transducers can be formed as a loudspeaker and/or microphone, which are embodied to bring about a movement of a movable element, i.e., a membrane, on the basis of an electric actuation signal such that a fluid is moved by moving the membrane and so a sound pressure level in the fluid is produced. In contrast to the loudspeaker configuration described above, a movement in the fluid may lead to a deflection of the membrane in a microphone configuration, said deflection of the membrane being able to be determined by a changeable electric potential and/or a changeable electric capacity, and so an electric signal can be obtained on the basis of a fluid movement.

MEMS sound transducers can be manufactured using semiconductor technology and/or may comprise semiconductor materials. In the exemplary embodiments described below, backplate electrodes or backplate structures of the sound transducer structure may form a stack with a membrane that is deflectable in relation to the backplate structure, wherein the backplate electrode and the membrane are held at respective edge regions, for example by way of a substrate. By way of example, the substrate can be an amorphous, polycrystalline or crystalline semiconductor material, for instance silicon.

Figure 1:
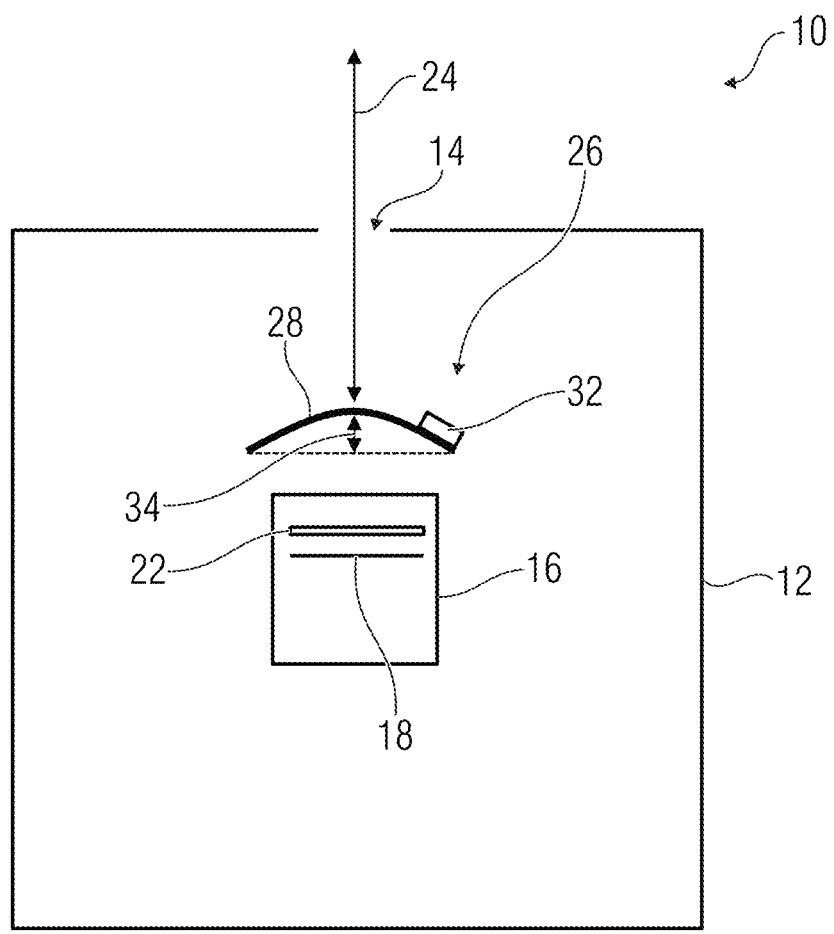
FIG. 1 shows a schematic block diagram of a microelectromechanical system according to one exemplary embodiment.

FIG. 1 shows a schematic block diagram of a microelectromechanical system to according to one exemplary embodiment. The microelectromechanical system (MEMS) 100 comprises a housing 12, which has an access opening 14. The access opening can act as an air inlet or sound inlet, or as an air outlet or sound outlet. The MEMS 10 comprises a sound transducer structure 16, which comprises a membrane structure 18 and a backplate structure 22. The housing 12 may be a structure that is not fully closed off and that may be configured, for example, to impede or prevent the approach of a fluid flow and/or an acoustic short circuit with a surrounding of the MEMS 10. The housing to may be formed from semiconductor material, plastic and/or metal and may be formed entirely, or else partly, from a potting compound, too.

The membrane structure 18 and/or the backplate structure 22 may comprise electrically conducting materials, and so a movement of the membrane structure 18 in relation to the backplate structure 22 may be determinable on the basis of a capacitive evaluation of the membrane structure 18 and the backplate structure 22, for example. Electrically conducting materials may, for example, be a part material, for example, gold, copper, silver, aluminum or the like and/or a doped semiconductor material.

The sound transducer structure 16 may be coupled to the access opening 14, and so a fluid flow 24, which may be understood to be a static, quasi-static or dynamic variation in a fluid pressure or sound pressure level, may reach the sound transducer structure 16 through the access opening 14. The fluid flow 24 may have a causal relation with a deflection of the membrane structure 18, particularly when operating the sound transducer structure 16 as a microphone and/or loudspeaker.

The MEMS 10 comprises a filter structure 26, which is arranged between the access opening 14 and the sound transducer structure 16. The filter structure 26 comprises a filter material 28 and at least one pretension element 32, which is mechanically connected to the filter material 28. The pretension element 32 is embodied to produce a stress in the filter material 28 in order to provide a bending deformation of the filter structure 26 in a direction away from the backplate structure 22. The mechanical connection between the filter material 28 and the pretension element 32 can be obtained, for example, by mechanical attachment, for instance using adhesives, but also by growing a material layer of the pretension element onto a layer of the filter material, or vice versa.

The filter material 28 can be embodied to represent a barrier for parts of the fluid flow 24, for example particles and/or liquids. To this end, the filter structure 26 or the filter material 28 may have a hole structure, the holes of which have a correspondingly small aperture size, for example a diameter. This facilitates the flow of the fluid flow 24 while stopping corresponding constituents of the fluid flow 24.

The bending deformation of the filter material 28 facilitates obtaining a distance 34 in relation to a non-deflected state of the filter material 28. Here, the distance 34 may relate to an obtained deflection of the filter material 28 in a central region of the filter structure 26, while the filter material 28 may be securely clamped in an edge region, for example, and, although it may have material stretching there, it may have no deflection, at least locally, under certain circumstances. The distance 34 facilitates low acoustic damping of the filter structure 26 in relation to the sound transducer structure 16, obtaining a good filter property and, simultaneously, being able to obtain proximity between filter structure 26 and sound transducer structure 16, for example by virtue of a few, some or all of the layers comprising the membrane structure 18, the backplate structure 22 and/or the filter material 28 being formed from the same stack.

Although FIG. 1 illustrates that the backplate structure 22 is arranged between the filter material 28 and the membrane structure 18, the membrane structure 18 may be arranged between the backplate structure 22 and the filter material 28 in the exemplary embodiments described here, without loss of generality.

Expressed differently, the filter structure 28 protects a sensor element, for example the sound transducer structure 16, from environmental influences, for example particles and/or water.

Exemplary embodiments facilitate the protection of the sensor structure by way of an integrated filter structure. Using this, it is possible to keep overall costs, a processing outlay and/or installation space low or reduce these. The protection structure that means the filter structure 28 can be implemented as a layer designed as a mesh. The smaller the embodiment of the holes thereof, the better and higher the filter effect of the filter structure 28 that is obtainable against particles and/or water. At the same time, however, influences on the disturbance properties of a microphone can be obtained, for example by reducing the signal-to-noise ratio (SNR), which can at least partly be compensated for by the backplate structure 22, for example by increasing the size of the holes.

Figure 2A:
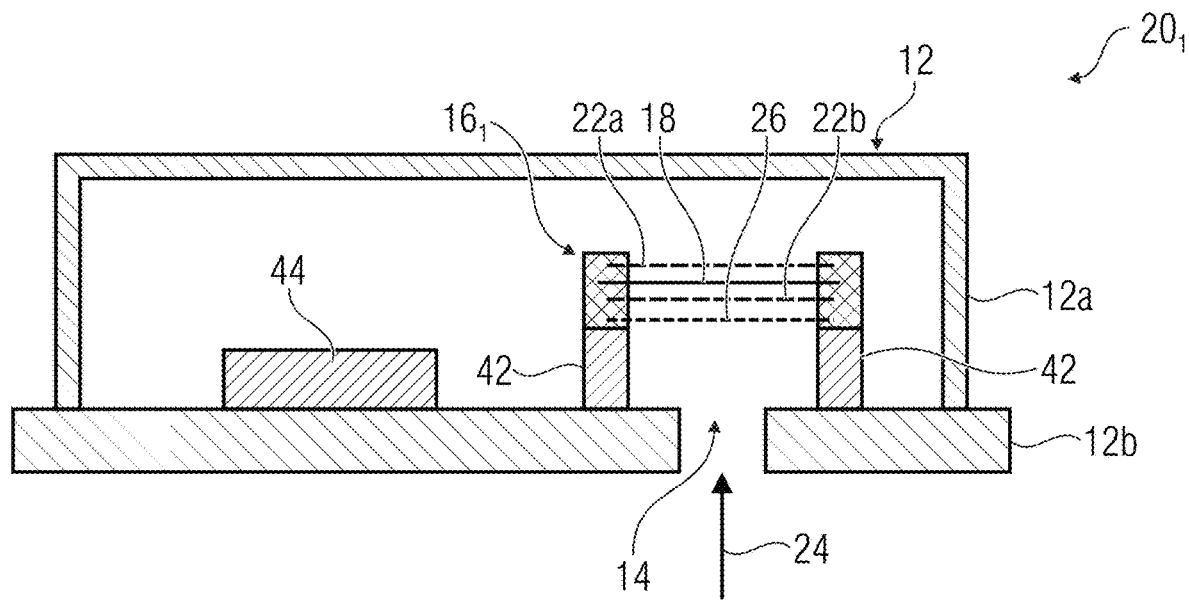
FIG. 2a shows a schematic side sectional view of a MEMS according to one exemplary embodiment, in which a housing is formed by a housing lid and a housing plate.

FIG. 2a shows a schematic side sectional view of a MEMS $20_1$, in which the housing 12 is formed by a housing lid 12a and a housing plate 12b. By way of example, the housing plate 12b can be a carrier substrate for electric lines or comprise these lines, for instance by virtue of the housing plate 12b being embodied as a circuit board or the like.

By way of example, the access opening 14 can be arranged in the housing plate 12b. Further elements may be arranged within the housing 12 in addition to a sound transducer structure $16_1$, which may be implemented for example as a sound transducer structure with a double backplate configuration, in which the membrane structure 18 may be arranged between two membrane structures 22a and 22b. By way of example, a substrate 42, which spaces the sound transducer structure $16_1$ apart from the access opening 14, may be arranged within the housing 12, i.e., between the access opening 14 and the sound transducer structure $16_1$. As an alternative or in addition thereto, an actuation circuit 44, which may be electrically coupled to the sound transducer structure $16_1$ and embodied to provide a functionality of same, may also be arranged within the housing 12. The actuation circuit 44 may comprise an amplifier which electrically amplifies electric signals received by the sound transducer structure $16_1$ and/or signals to be supplied thereto.

The filter structure 26 can be understood to be an integrated filter element in relation to the MEMS $20_1$. In accordance with the illustration in FIG. 2a, the pretension element of the filter structure 26 is little active or inactive, meaning FIG. 2a shows the MEMS $20_1$ in a state in which the filter material is non-deflected.

Figure 2B:
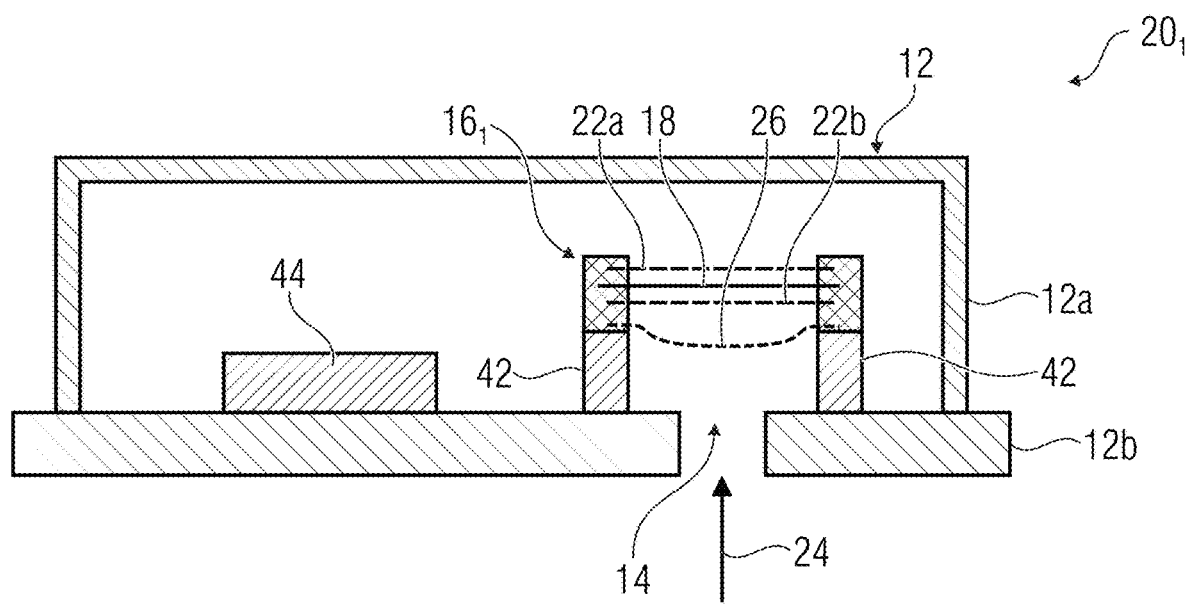
FIG. 2b shows a schematic side sectional view of the MEMS of FIG. 2a, in which a pretension element is effective in order to deflect the filter structure.

FIG. 2b shows a schematic side sectional view of the MEMS $20_1$, in which the pretension element is effective, and so the filter structure 26 or the filter material is deflected so as to have a distance from the backplate structure 22b, 10 the backplate structure 22a and/or the membrane structure 18 that has been increased in comparison with the illustration of FIG. 2a.

Figure 3A:
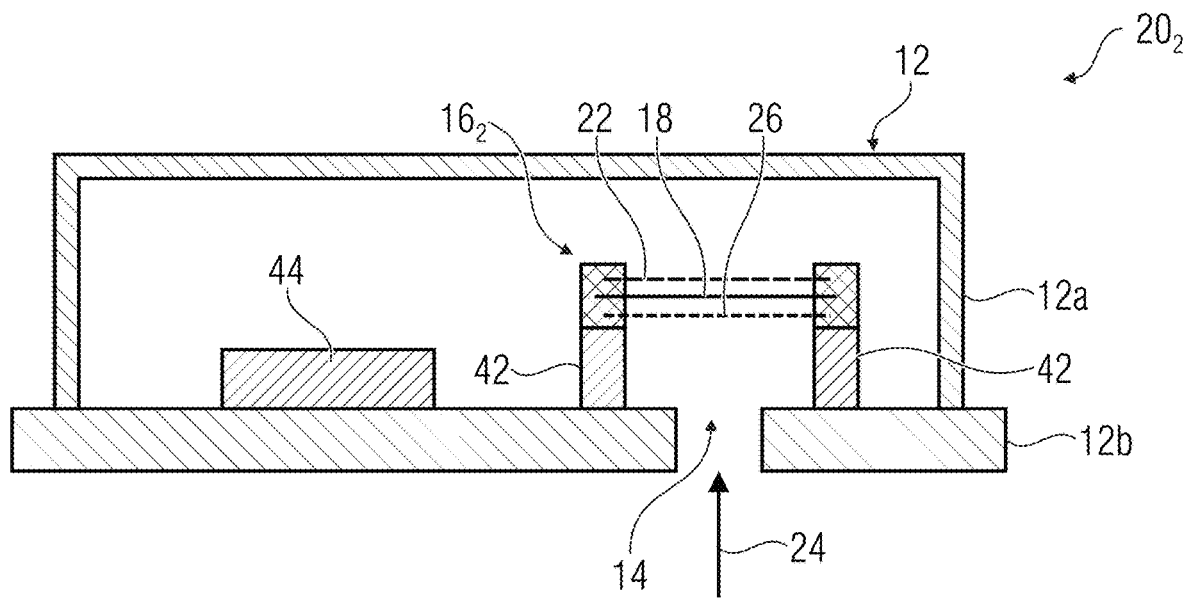

FIG. 3a shows a schematic side sectional view of a MEMS $20_2$ which, in comparison with the MEMS $20_1$, has a modified sound transducer structure $16_2$. The sound transducer structure $16_2$ has a single backplate configuration, in which the membrane structure 18 may be deflectable in relation to a single backplate structure 22. By way of example, the backplate structure 22 can be arranged in such a way that the membrane structure 18 is arranged between the backplate structure 22 and the filter structure 26. Alternatively, it is likewise possible for the backplate structure 22 to be arranged between the membrane structure 18 and the filter structure 26. Without the intention being that the terms "top", "bottom", "left", "right", "front" and "back" develop restrictive effect in the exemplary embodiments described here, the MEMS $20_2$ can be described in such a way that the sound transducer structure $16_2$ is arranged above the access opening 14, and so the membrane structure 18 is fluidically coupled to a surroundings of the MEMS $20_2$ via the access opening 14.

Figure 3B:
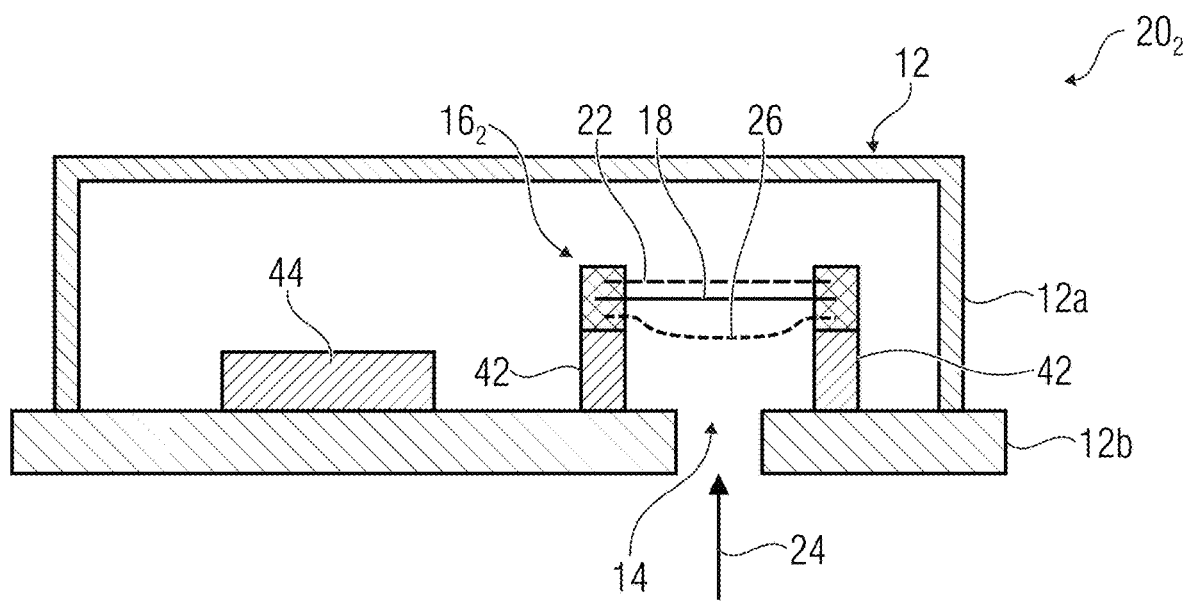
FIG. 3b shows a deflected state of a filter structure of FIG. 3a according to one exemplary embodiment.

While FIG. 3a, in a manner comparable to FIG. 2a, shows a non-deflected state of the filter structure 26, FIG. 3b show a deflected state of the filter structure 26, in which the filter structure 26 is deflected in such a way that, in comparison with FIG. 3a, it has a greater distance from the membrane structure 18 and/or the backplate structure 22. The deflected state of the filter material can be maintained by effective pretension elements.

The deflection of the filter structure 26 or of the filter material 28, which can be suspended or clamped in a substrate 46 for example a semiconductor substrate, is referred to below on the basis of FIG. 4a to FIG. 4h.

Figure 4A:
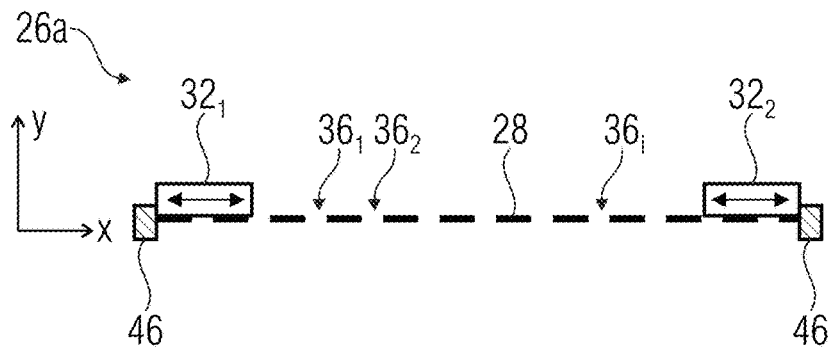
FIGS. 4a-4h show schematic side sectional views of different configurations of filter structures according to exemplary embodiments.

FIG. 4a shows a schematic side sectional view of the filter structure in a first configuration 26a, in which the filter material 28 has a multiplicity of holes 36i, through which the fluid flow can migrate. By way of example, two pretension elements $32_1$ and $32_2$ are securely connected to the filter material 28, wherein use may also be made of any other number of pretension elements, for example, one, three or more, four or more, five or more, ten or more, for example 15. By way of example, the filter material 28 can be a structure that is securely connected to a substrate around the circumference, and so a single pretension element 32 may likewise be arranged as a circumferential element. Alternatively, use can also be made of a greater number.

The pretension elements $32_1$ and $32_2$ may be securely mechanically connected to the filter material 28 and may be embodied to produce a stress in the filter material 28. By way of example, this may be provided by different coefficients of thermal expansion. As an alternative or in addition thereto, at least one of the pretension elements $32_1$ and/or $32_2$ may be configured in a different way in order to produce a stress in the filter material 28. By way of example, a direction of principal extent of the filter material 28 may be parallel to an x-direction, with a surface normal of the filter material 28 being able to be arranged perpendicular thereto and parallel to a y-direction. By way of example, the pretension elements $32_1$ and/or $32_2$ may be embodied to extend along the x-direction in relation to the filter material 28 in order to produce the stress in the filter material 28. By way of example, the pretension elements $32_1$ and $32_2$ may be produced or processed at the same time as the filter material 28 such that both have the same temperature, during which a substantially tension-free state is present between the filter material 28 and the pretension elements $32_1$ and $32_2$. By heating and/or cooling the stack to a different temperature, the filter material 28 and a material of the pretension elements $32_1$ and/or $32_2$ may expand differently, and so, for example, the pretension elements $32_1$ and $32_2$ increase in size in relation to the filter material 28 and produce the stress on the basis of the mechanical connection to the filter material 28.

By way of example, the filter material 28 can be a silicon material and a material of the pretension elements $32_1$ and/or $32_2$ may comprise a silicon nitride material, for example silicon nitride (SiN) or silicon oxynitride (SiON). By way of example, the filter material may have a polycrystalline silicon material and the pretension elements $32_1$ and/or $32_2$ may have the nitride material.

Figure 4B:
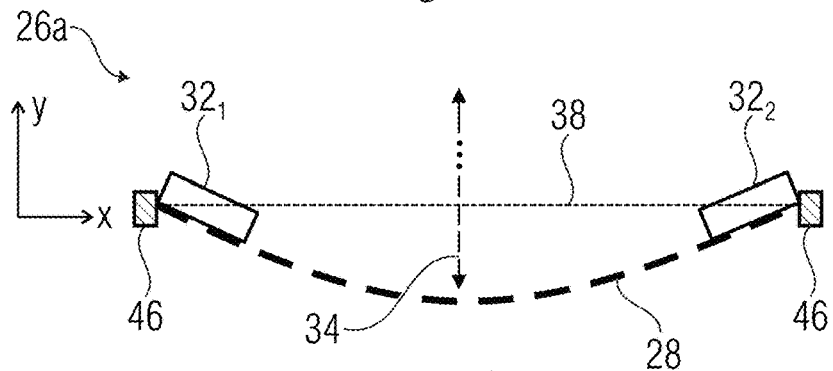

FIG. 4b shows a schematic side sectional view of the deflected state of the filter structure 26a, in which the deflection of the filter material 28 is obtained on the basis of the stress, and so the distance 34 from a backplate structure, not illustrated here, is obtained. The distance 34 can be understood to be a deflection of the filter material 28 in relation to a non-deflected state, which is indicated by a dashed line 38, for example.

Figure 4C:
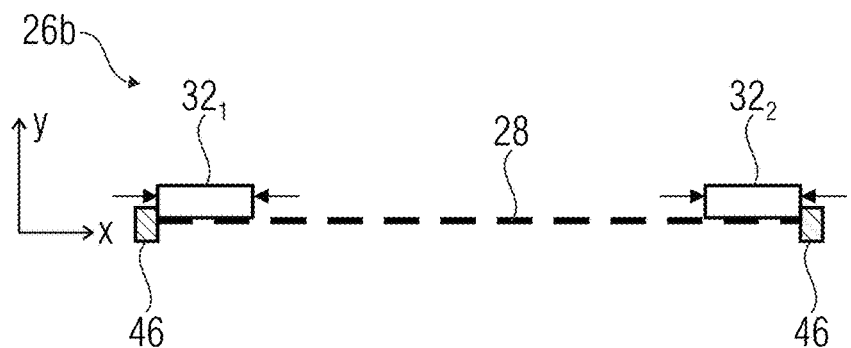

FIG. 4c shows a schematic side sectional view of the filter structure in a second configuration 26b, in which the pretension elements $32_1$ and $32_2$ are embodied, in comparison with the first configuration 26a, to contract in relation to the filter material 28, and so the stress can be obtained on the basis of the contraction of the pretension elements $32_1$ and $32_2$.

While the locations of the arrangement of the pretension elements $32_1$ and/or $32_2$ may be the same or comparable in comparison with FIG. 4a, a contraction of the pretension elements $32_1$ and/or $32_2$ facilitates a deflection of the filter material 28 and the distance 34 along the positive y-direction, while the deflection according to FIG. 4b may be implemented along the negative y-direction.

By way of example, the configuration 26b can be obtained by virtue of a reference state or a tension-free state being related to a temperature, for example, which is lower than a temperature at which the deflection state is obtained; this means that the filter material 28 and the pretension element or elements 32₁ and/or 32₂ heat up in order to provide the deflection.

Even though the configurations 26a and 26b are described in such a way that the pretension elements 32₁ and/or 32₂ are arranged in an edge region of the filter material 28, other locations are also possible. Here, locations of greatest material strain lend themselves to this end, as these can lead to a great deflection of the filter material 28. By way of example, if the filter material 28 is securely clamped in the edge regions, locations of large mechanical strain may be arranged adjacent thereto. The configurations 26a and 26b are presented in such a way that a possible single antinode of the filter material 28 is obtained, which may be arranged in a central region of the filter structure 28. It is understood that other deflection lines may also be produced, for example with a larger number of deflection maxima. This also leads to a larger number of locations with greater or greatest strain in the filter material 28, which may influence the selection of the locations for attaching the pretension elements 32₁ and/or 32₂ or other pretension elements.

As an alternative to locations of great or maximum strain, it is also possible to choose locations with other properties, for example locations with a large or maximum amplitude of the distance 34.

Figure 4D:
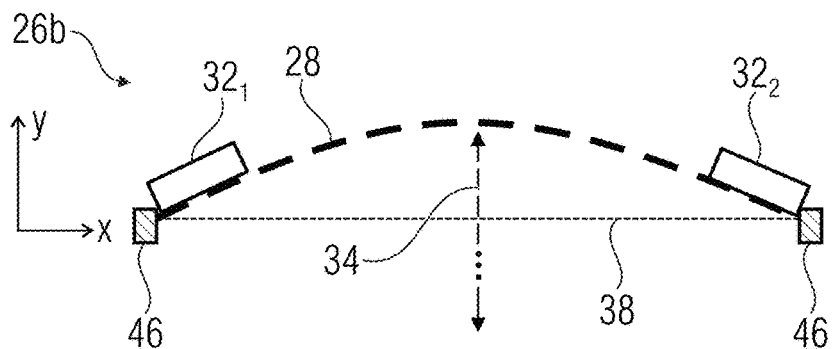

FIG. 4d shows a schematic side sectional view of the deflected state of the filter structure 26b, in which the deflection of the filter material 28 is obtained on the basis of the stress.

Figure 4E:
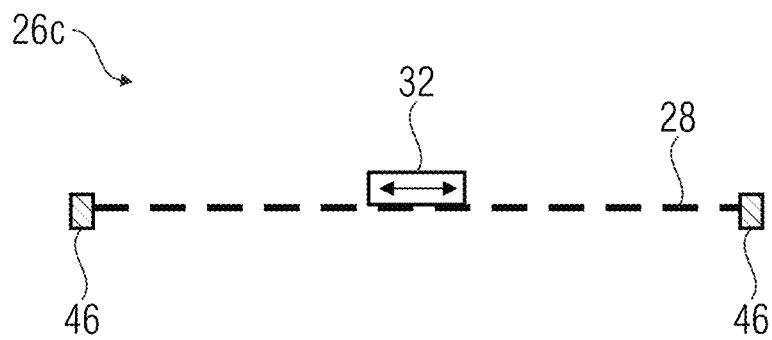

FIG. 4e shows a schematic side sectional view of the filter structure in a third configuration 26c, in which a possibly single pretension element 32 is arranged in a central region of the filter material 28 and said pretension element is configured to expand in relation to the filter material, as described in conjunction with FIG. 4a. A possible pretension element can be obtained using TEOS (tetraethyl orthosilicate), wherein other materials may be used, too, in particular materials that are compatible with etching processes such as an HF etching process (HF=hydrogen fluoride; hydrofluoric acid).

Figure 4F:
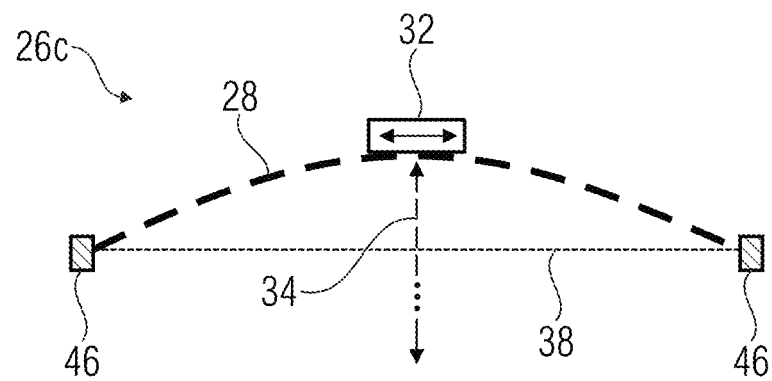

FIG. 4f shows a schematic side sectional view of the configuration 26c in the deflected state, in which the distance 34 in relation to the reference state is obtained.

Figure 4G:
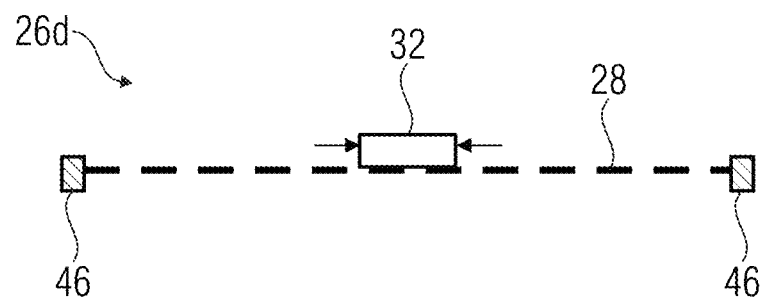

FIG. 4g shows a schematic side sectional view of the filter structure in a fourth configuration 26d, in which the pretension element 32, in comparison the configuration 26c, is embodied to contract in relation to the filter material 28 in order to provide the stress.

Figure 4H:
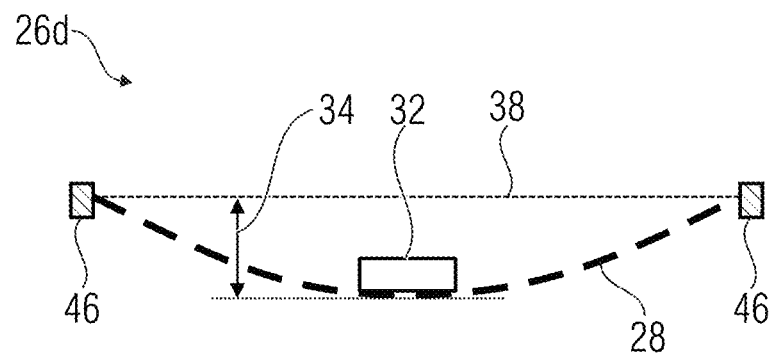

FIG. 4h shows a schematic side sectional view of the filter structure from FIG. 4g in the fourth configuration 26d, in which the filter material 28 is deflected on the basis of the obtained stress in order to provide the distance 34 in relation to the reference state indicated by the line 38.

FIG. 4a to FIG. 4h elucidate that a deflection of the filter material 28 can be obtained by a different number of attachments and/or different locations of the attachment of at least one mechanical pretension element. The pre-stress can be obtained by different coefficients of thermal expansion in relation to a common reference state, which possibly, but not necessarily, describes a temperature range during the production. As an alternative to this concept, an actuation may also be used in order to obtain stress, for example by applying a temperature, a force produced by means of an actuator or the like.

Figure 5A:
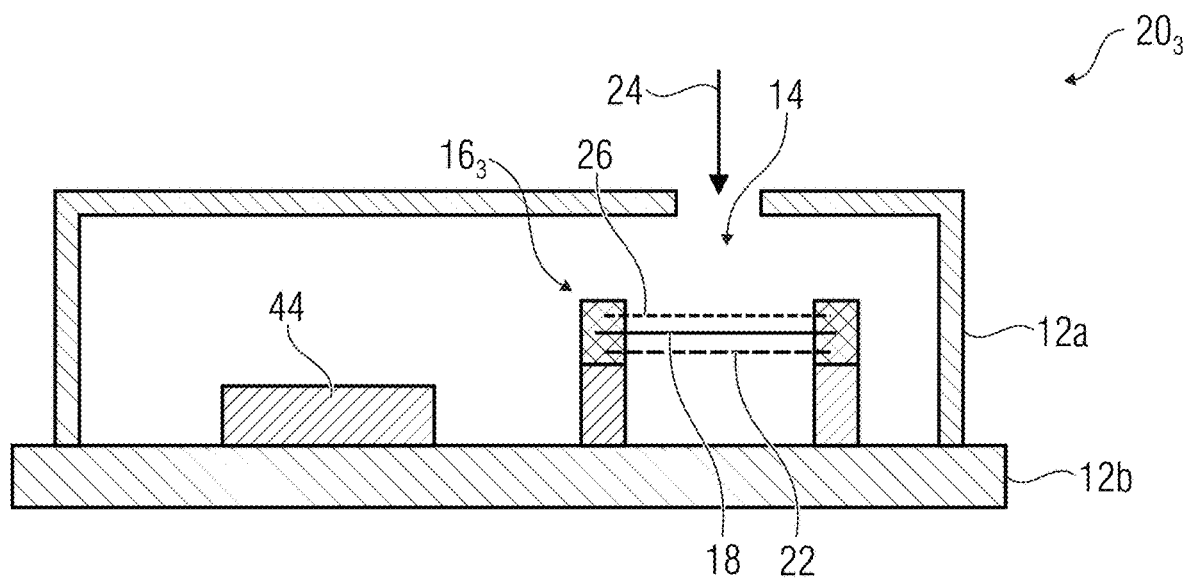
FIG. 5a shows a schematic side sectional view of a MEMS according to one exemplary embodiment, which has an access opening in a housing lid.

FIG. 5a shows a schematic side sectional view of a MEMS 20₃ which, in comparison with the MEMSs 20₁ and 20₂, has the access opening 14 in the housing lid 12a; this means that the fluid flow 24 can reach to a sound transducer structure 16₃ from a direction that is referred to as upper side, for example. The sound transducer structure 16₃ can be formed as a single backplate or dual backplate configuration. In the case of a single backplate configuration, the sound transducer structure 16₃ can have the backplate structure 22 closer to the access opening 14 or closer to the housing plate 12b in relation to the membrane structure 18. FIG. 5a shows the MEMS 20₃ in a non-deflected state of the filter structure 26.

Figure 5B:
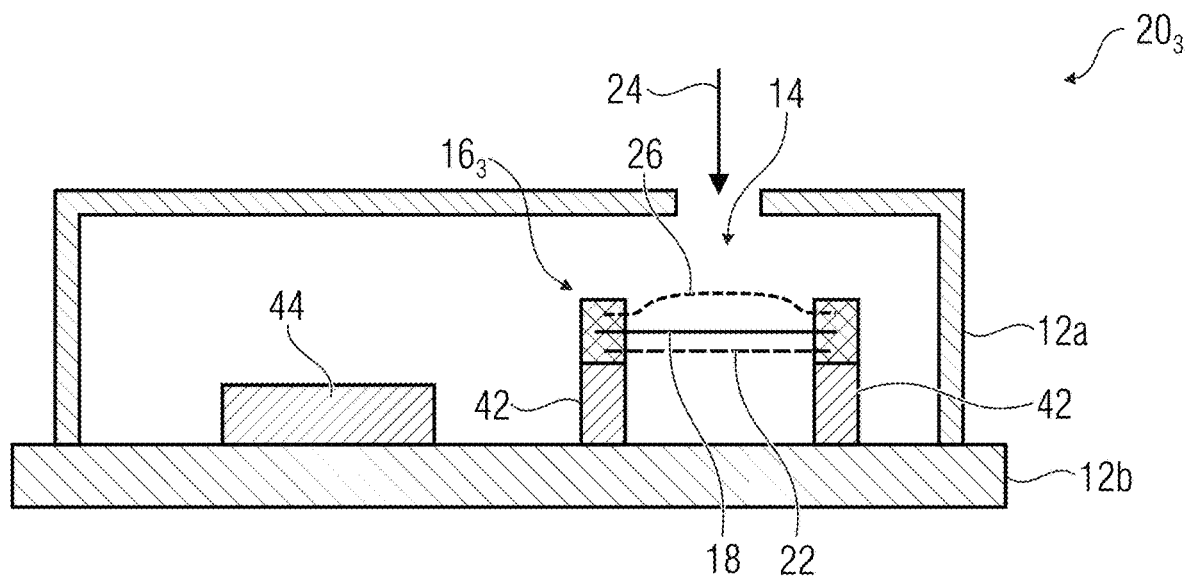
FIG. 5b shows a schematic side sectional view of the MEMS of FIG. 5a in a deflected state of the filter structure.

FIG. 5b shows a schematic side sectional view of the MEMS 20₃ in a deflected state of the filter structure 26. Here, the filter structure 26 is deflected in such a way that the distance in relation to the backplate structure 22 and/or the membrane structure 18 increases.

The features that were described in conjunction with the MEMSs 20₁, 20₂ and 20₃ are combinable with one another as desired. In particular, a configuration of the housing, a position of the access opening 14 therein and a configuration of the sound transducer structure can be interchangeable as desired in view of a single backplate and dual backplate and an orientation of the backplate structure in the case of a single backplate configuration.

Figure 6:
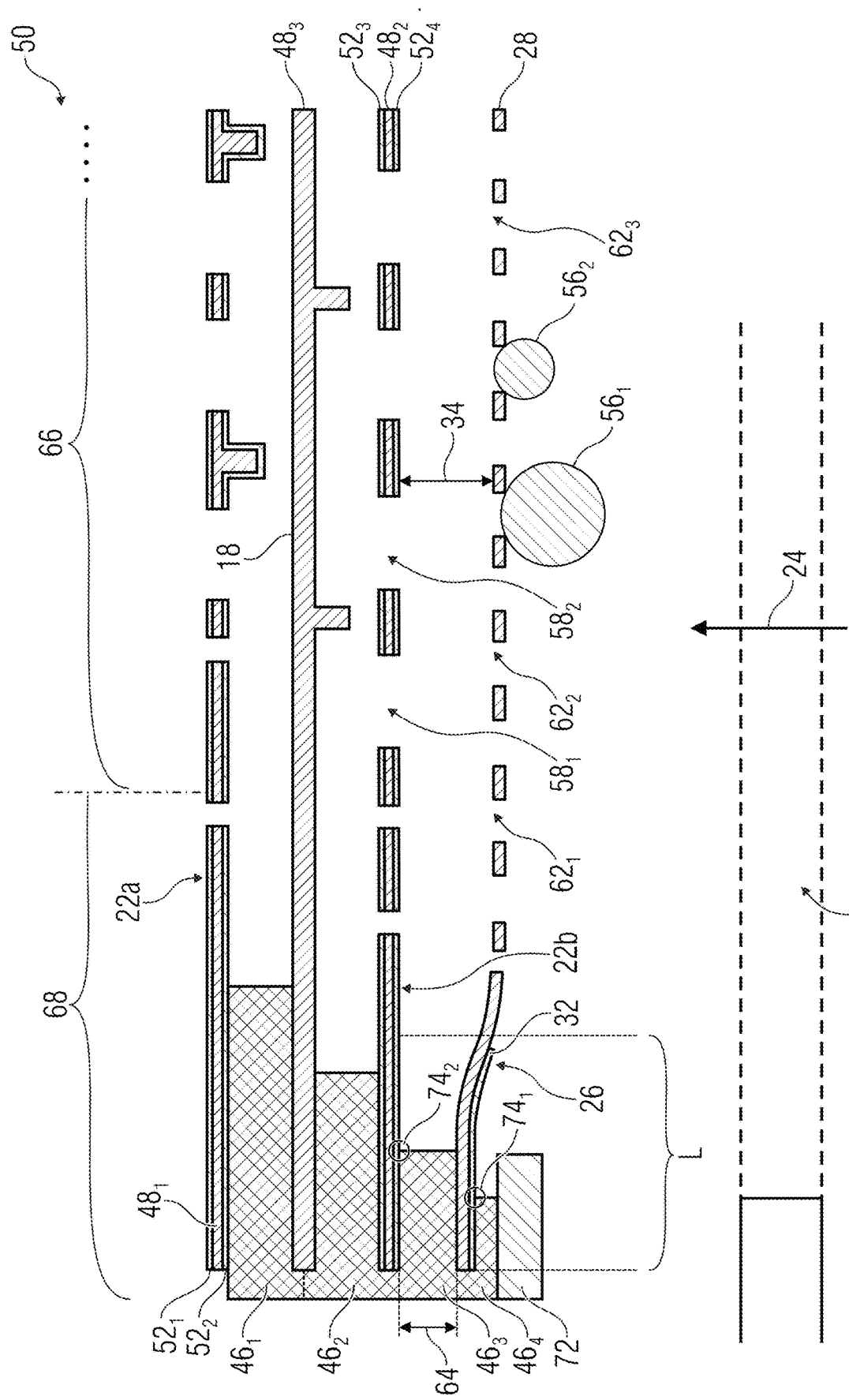
FIG. 6 shows a schematic side sectional view of a section of a MEMS according to one exemplary embodiment.

FIG. 6 shows a schematic side sectional view of a section of a MEMS 50 according to one example embodiment. By way of example, only a lateral section of the MEMS 50 is shown, meaning that the illustrated structures can have an extension in the direction of the right edge of the picture. Further, the MEMS 50 is formed in such a way, for example, that the membrane structure 18 is arranged between two backplate structures 22a and 22b.

By way of example, the MEMS 50 can be formed by a layer stack, which has a multiplicity of layers and from which the backplate structures 22a and 22b and the membrane structure 18 are exposed in a central region, for instance by a chemical or mechanical etching process for facilitating the functionality of the MEMS 50. By way of example, the backplate structures 22a and 22b and the membrane structure 18 can be held by the semiconductor substrate 46 in the edge region, meaning that they are securely clamped therein, wherein the semiconductor substrate 46 may have a plurality of layers 46₁ to 46₄. Alternatively, the semiconductor substrate also may be formed by a single layer, by two or more layers, three or more layers or five or more layers, for example ten, 20 or even more.

By way of example, the substrate material 46 can be or comprise a semiconductor material, for instance silicon. By way of example, the semiconductor material can be obtained using TEOS (tetraethyl orthosilicate). A material of the semiconductor substrate layers 46 to 46i arising thus can be electrically insulating and, for example comprise or be formed of a silicon oxide material. The use of nitride as an insulation material of the layers 52₁ to 52₄ facilitates the unburdening of load points 74₁ and/or 74₂, which could cause damage to the semiconductor material of the layer 28 or 48 in the case of a movement of the corresponding structure. Expressed differently, hotspots (load points) 74 are protected by SiN with high tensile strength. The insulation material can be arranged as a SiN taper, wherein the use is silicon nitride material may facilitate a large deflection of the filter material 28 since it can provide a high tensile stress in the silicon material.

The backplate structures 22a and 22b and the membrane structure 18 can be electrically conducting, and so a movement of the membrane structure 18 in relation to the backplate structures 22a and/or 22b is detectable by evaluating electric potentials or capacitance values, or a movement of the membrane 18 can be obtained by applying electric potentials or charge carriers. In comparison with the membrane structure 18, the backplate structures 22a and/or 22b can be deflectable to a small extent. By way of example, in reaction to a comparatively large force acting on the membrane structure 18 and the backplate structures, a travel of a deflection of the backplate structures may be smaller by a factor of less than 0.1, less than 0.05 or less than 0.01.

By way of example, the backplate structures 22a and 22b themselves can be formed as multi-layer elements and, for example, comprise an electrically conducting layer 48, which is covered by one or more insulating layers $52_1$ and/or $52_2$ on one or both main sides in order to avoid a short circuit in the case of a mechanical contact with a further electrically active structure. Likewise, the backplate structure 22b can comprise an electrically conducting layer $48_2$, which is covered by an electrically insulating layer $52_3$ or $52_4$, for example on both sides.

The electrically conducting layers $48_1$ and/or $48_2$ may comprise a doped semiconductor material and/or a metal material. By way of example, the insulating layers $52_1$ to $52_4$ can comprise an oxide material or a nitride material, for example silicon nitride or silicon oxynitride.

By way of example, the membrane structure 18 can be formed as an electrically conducting layer $48_3$. Optionally, the membrane structure 18 may also be covered, at least at points, by an electrically insulating layer on one side or both sides, with the electric insulation to the backplate structures preferably being arranged on the backplate structures themselves in order to facilitate a low mass of the membrane structure 18.

The layer stack or the MEMS 50 may comprise the filter structure 26, which is embodied as a bimorph structure, for example. This means that, in a pretension region 54 arranged, for example, in an edge region of the MEMS 50, the filter material 28 is covered, at least at points or completely, by the pretension element 32. Here, the filter material 28 may have an electrically conducting embodiment and, for example, comprise the same material as the conducting layers $48_1$ and/or $48_2$ and/or a membrane material of the membrane structure 18, meaning of the layer $48_3$. The pretension element 32 may be arranged on a side of the filter material 28 facing away from the backplate structure 22b.

By way of example, the MEMS 50 is configured in such a way that the backplate structure 22b is arranged between the access opening 14 and the membrane structure 18. Such a configuration may lead to particles $56_1$ and/or $56_2$ of the fluid 24 possibly being able to reach the backplate structure 22b, while the backplate structure 22a is impinged with particles to a lesser extent or not at all. The filter structure 26 can now be used to keep the particles $56_1$ and/or $56_2$ away from the backplate structure 22b. This allows openings or holes 58 of the backplate structure to be formed to be comparatively large since they are at least partly freed from a functional requirement of keeping particles away. This function can be provided by the filter structure 26, and so openings or holes 62 of the filter structure 26 may be formed with a smaller dimension than the holes 58. What can arise therefrom is that the filter structure 28 influences an acoustic behavior of the sound transducer apparatus. At the same time, known process parameters can be maintained, in particular layer thicknesses of the substrate 46.

According to an exemplary embodiment, a diameter or comparable dimension of the openings 62 which determines the particle dimension for which the filter structure 26 is mechanically impermeable is a dimension that is smaller than the distance 34, and so particles passing through the filter structure 26 are small enough to prevent simultaneous contact with the filter structure 26 and the backplate structure 22b. The dimensions of the holes 62 can be chosen in such a way that particles that fit through the holes 62 do not lead to a substantial impairment when they arrive in a region between the backplate 22b and the membrane structure 18.

Thus, for example, a layer thickness 64 of the substrate layer $46_3$ between the backplate structure 22b and the filter structure 26 may be small with an appropriately corresponding distance between the backplate structure 22b and the filter structure 26 in the edge region and, for example, have a value of at least 0.5 µm and at most 3 µm, at least 1 µm and at most 2.5 µm or at least 1.5 µm and at most 2.2 µm, for example 2 µm. The distance 34 can be at least 6 µm, at least 8 µm or at least 10 µm on the basis of the pretension element 32. The distance can be understood to be the increase of the distance provided by the layer thickness 64 and can have, for example, at least twice the value of the layer thickness 64, at least a value of 2.5, at least a value of 3 or even more, for example 5. The deflection by the pretension element allows a large distance 34 to be obtained while avoiding a deposition of correspondingly great layer thicknesses at the edge. Expressed differently, the backplate structure 22b may have the distance 64 from the filter structure 26 in the edge region 68 of the backplate structure 22b and the distance 34 in the central region 66. The distance 34 can have a value of at least a twofold value, at least a threefold value, at least a fourfold value or else at least a fivefold value and have a value of at least 6 µm, at least 8 µm or at least 10 µm, for example.

Here, the central region 66 can be understood to be the region of the membrane structure 18 that is configured for deflection of same. The edge region 68 can be understood to be a clamping region or holding region, in which the respective layers can be anchored and/or which remains of an exposure of the individual partial structures 22a, 18, 22b and 26.

By way of example, a base layer 72 of the layer stack can be a silicon layer, for example the remainder of a silicon wafer on which the further layers were produced or arranged. By way of example, the silicon material of the base layer 72 may be comparatively sensitive to etching if an etching sensitivity of the semiconductor substrate 46 is called upon in comparative fashion. By way of example, an exposure of the individual layers can be implemented from a direction in which the access opening 14 is arranged such that the layers $46_1$, $46_2$, $46_3$ and $46_4$ may have an increasingly longer dwell time in an etching material in the aforementioned sequence. Therefore, these layers may experience an increase in ablation in the aforementioned sequence, and so the insulation material of the substrate 46, which is arranged between the backplate structure 22b and the filter structure 26 in the edge region 68, is ablated to a greater extent in the region of the filter structure 26 and so the filter structure is exposed from the isolator material of the semiconductor substrate 46 to a greater extent in terms of area than the backplate structure 22b. This may also mean that the isolator material covers a side of the filter structure 26 facing the backplate structure 22b to a greater extent in terms of area than a side facing away from the backplate structure 22b. If a configuration of the layer sequences is modified, for example such that the filter structure 26 is arranged adjacent to the backplate structure 22a, the insulation material may also cover the side of the filter structure facing the backplate structure to a lesser extent than the side facing away from the backplate structure. In simplified fashion, this can be understood in such a way that the holding oxide of the layers 46 can be ablated to a respective higher degree on both sides.

Here, the filter structure 26 can be formed in such a way that the filter structure 26 is mechanically impermeable to particles 56 with a certain, and greater, particle diameter. By way of example, the filter structure 26 can be formed in such a way that the latter is mechanically impermeable to particles with a diameter of at least 6.5 μm, at least 6 μm or at least 5.5 μm.

As illustrated on the basis of FIG. 7a and FIG. 7b, the amplitude of the distance 64 may be at least partly determined by an extent or scope of the coverage of the filter material 28 with the insulation material of the semiconductor substrate 46₃, with it being possible to consider that side of the filter material that faces away from the pretension element 32. By way of example, this may be satisfied for the MEMS 50 by the layer 46₃. A deflection of the filter material 28 can be reduced or prevented by the pretension element 32 in a region 76 in which the filter structure opposite to the pretension element 32 is covered by the semiconductor substrate 46. Outside of the region 76 in the direction toward the central region, the pretension element 32 can produce a deflection of the filter material 28 in order to produce the distance 34 to the backplate structure 22a in the central region. This allows the width of the exposed bimorph region, meaning an extent of a region 78 within which the filter structure can deform and within which the deformation element 32 is arranged, to be able to be independent of a position of a Bosch cavity, which may refer to those regions, for example, within which the base layer 72 is removed. A difference 82 between the ablation of the base layer 72 in the case of a MEMS 50a manufactured during a first cycle and a MEMS 50b manufactured during a second cycle, or a difference between two MEMSs 50a and 50b manufactured at the same time, may have a value of up to ±20 μm in relation to one another here and consequently provide little precision. Exemplary embodiments facilitate at least partial independence of this parameter since the deflection of the filter structure 26 is determined by an ablation of the semiconductor material 46, which can be ablated with high precision, for instance by an etching process. This may facilitate the distance 34 being set exactly and hence facilitate a high reproducibility.

Figure 8:
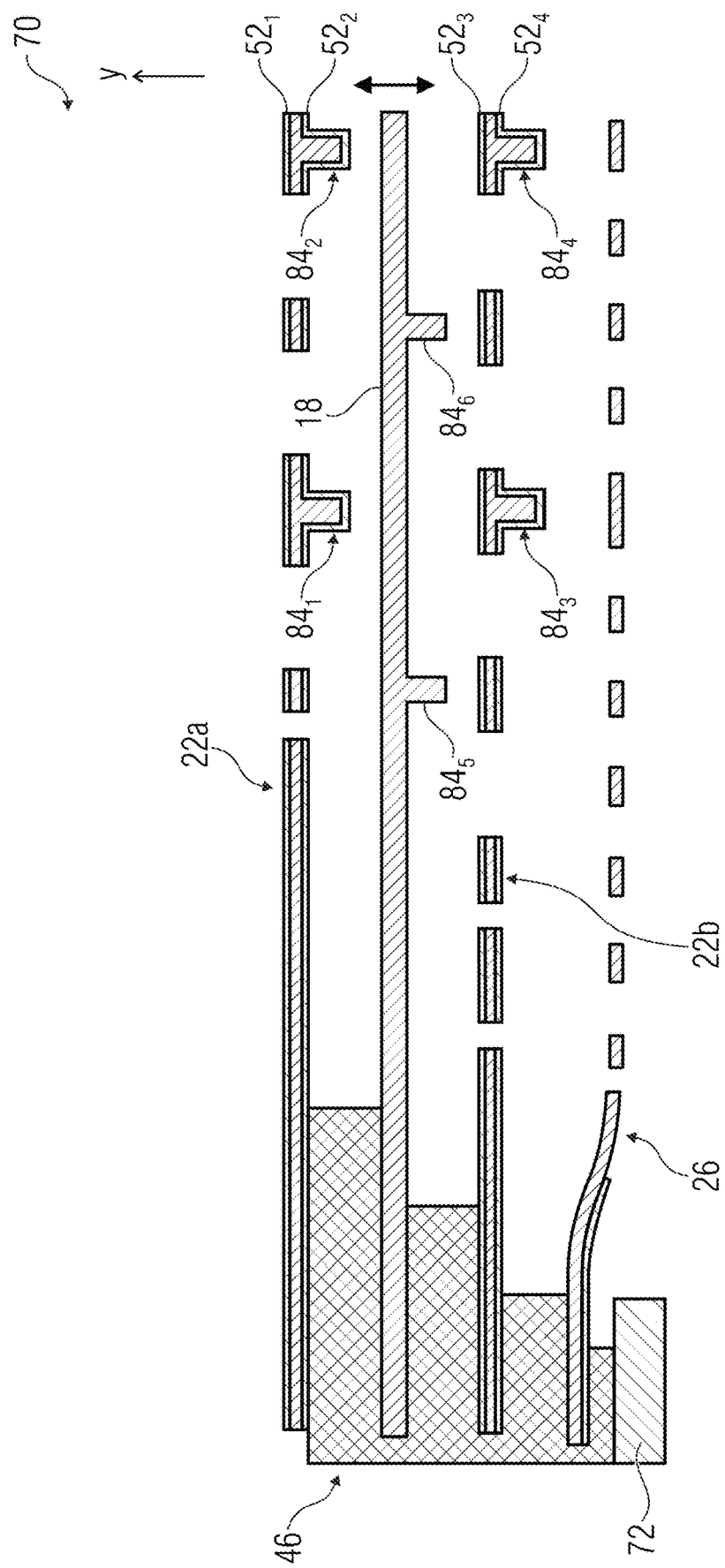
FIG. 8 shows a schematic side sectional view of a MEMS according to one exemplary embodiment, in which backplate structures have anti-sticking elements.

FIG. 8 shows a schematic side sectional view of a MEMS 70 in correspondence with exemplary embodiments described herein, in which the backplate structures 22a and 22b have raising elements (anti-sticking elements) 84. Here, the anti-sticking elements 84₁ and 84₂ of the backplate structure 22a may be directed in the direction of the membrane structure 18. These anti-sticking elements 84₃ and 84₄ can be directed in the direction of the filter structure 26. Optically, the membrane structure 18 may likewise have anti-sticking elements 84₅ and/or 84₆, which project into a region between the membrane structure 18 and the backplate structure 22b. Anti-sticking elements 84 allow an a real contact between two adjacent elements to be avoided in the case of a mechanical abutment therebetween and, instead, allow the contact to be implemented mainly in a region of the anti-sticking elements 84, and so adhesion is prevented. The membrane structure 18 is movable along the y-direction, for example, and may be configured to engage in mechanical contact with the backplate structures 22a and 22b during the production and/or operation. Sticking can be reduced or prevented by the anti-sticking elements 84. As shown in conjunction with the MEMS 70, anti-sticking elements can project into all interstices between the elements 22a and 18, 18 and 22b and 22b and 26. By way of example, a location of the attachment of the anti-sticking elements can be at least influenced by a layer sequence, which is used for the production of the MEMS. By way of example, the anti-sticking elements 84 can be formed in a manner similar to a stalactite such that they are introduced into a subsequently deposited layer or a layer deposited on top and (at least during the production) point downward. This means that the anti-sticking elements 84₃ and 84₄ may be arranged on the backplate structure 22b and/or the filter structure 26. Alternatively, or in addition thereto, the anti-sticking elements can be arranged at any structure.

The filter structure 26 can be brought to the same potential as the backplate structure 22b. This facilitates the reduction or prevention of parasitic effects, according to which the filter structure 26 acts with the membrane structure 18 in capacitive fashion. Irrespective thereof, electric insulation may be arranged between the backplate structure 22b and the filter structure 26 and said electrical insulation may be implemented by way of the insulation layers 52₂ and 52₄, for example, which are also formed by way of the anti-sticking elements 84. The electrical insulation facilitates the avoidance of a short circuit, which may be unwanted despite the same potential. Even though the filter material can also be embodied in electrically uncontacted (floating) fashion, it can alternatively also be placed at the same or similar potential as the membrane structure 18, for example.

Even though only two anti-sticking elements of the structure 22a, 18 and 22b are illustrated, reference is made to the fact that anti-sticking elements can be arranged in a great number, for example in each case totaling more than two, more than five, more than ten, more than 50 or more than 100.

Figure 9:
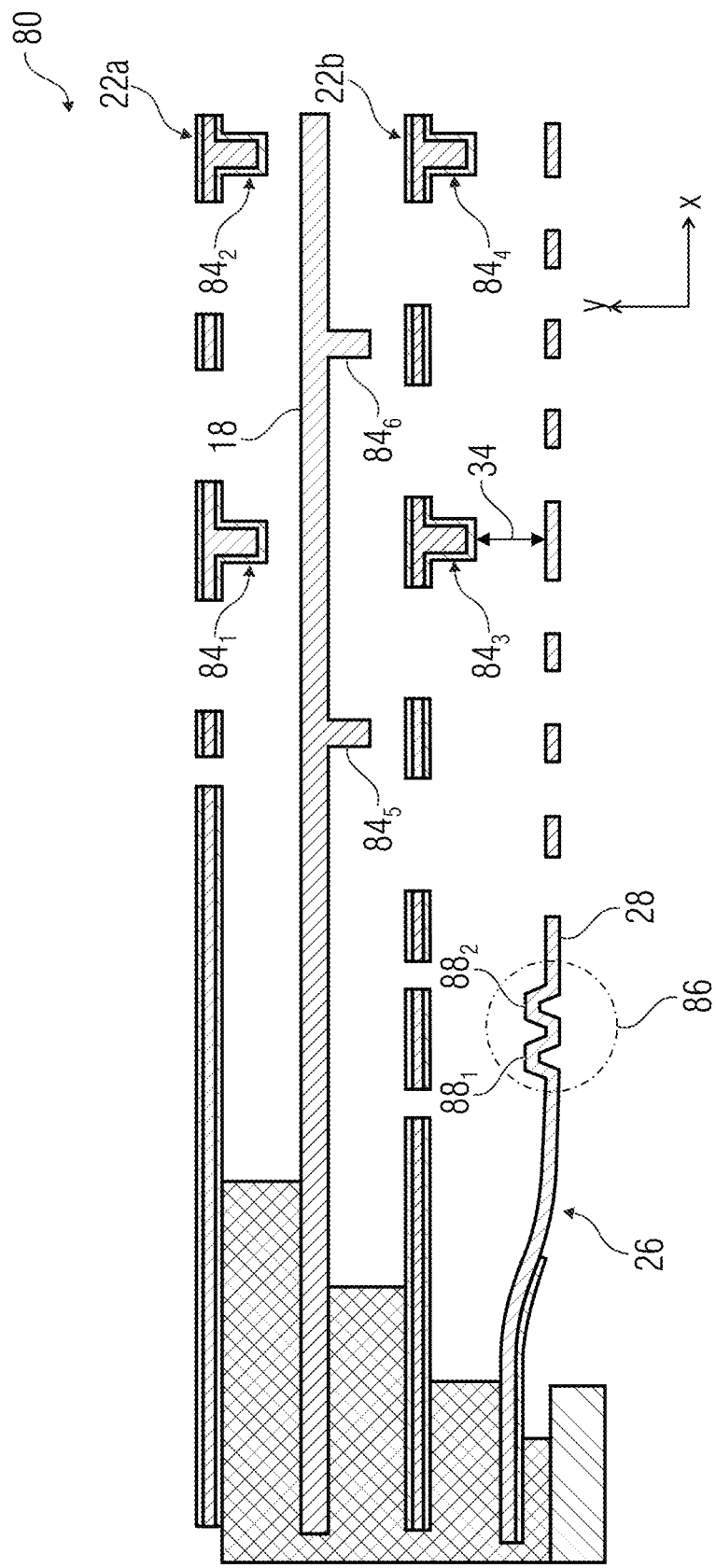
FIG. 9 shows a schematic side sectional view of a MEMS according to one exemplary embodiment, in which the filter structure has a corrugation.

FIG. 9 shows a schematic side sectional view of a MEMS 80 according to one exemplary embodiment, which may have a similar embodiment to the MEMS 70, wherein the arrangement of the anti-sticking elements 84 is optional and may also be dispensed with. The filter structure has a corrugation or waviness 86, which may comprise one or more travel increases 88₁ and/or 88₂, which are embodied to provide a travel increase perpendicular to the deflection of the filter structure 26 along the y-direction, for instance along the x-direction, within the scope of said deflection. Here, a scope of the travel increase may be set in such a way that it at least provides the additional extent that can be claimed by the deflection of the filter structure 26, wherein tolerance ranges of ±50%, ±30% or ±10% may be applied in this case. By way of example, the additional deflection in the case of an exemplary membrane radius of 400 μm and a deflection of 8 μm may yield a new membrane radius from:

$$\sqrt{((400)^2+8^2)}=400.08.$$

Hence an additional travel of 0.08 μm may be provided, wherein this additional travel may be applied with the aforementioned tolerances. A design criterion may comprise the corrugation, making the filter layer softer and hence more extendable. More length/extension can be provided by the corrugation as the amount of deflection that can be or should be provided during subsequent operation increases. On the basis of a geometry of the filter structure 26 and on the basis of a deflection of the filter material for establishing the distance 34, the corrugation can provide a travel increase with a value of, for example, at least 0.1 μm, at least 0.2 μm, at least 1 μm, at least 2 μm or any other, geometry-dependent value.

Accordingly, the corrugation 86 can act as a length compensation which provides the travel claimed by the deflection of the filter structure. The corrugation 86 can act like a spring which has a soft embodiment along the x-direction perpendicular to the deflection direction.

Expressed differently, the corrugation can act like a spring, whose elasticity is high and whose stiffness is low, at least along the x-direction, in order to increase or facilitate the deflection of the filter material 28.

Figure to shows a schematic side sectional view of a part of a MEMS 90 according to one exemplary embodiment, which is formed as a single backplate configuration, in which the filter structure 26 is arranged in such a way that the membrane structure 18 is arranged between the backplate structure 22 and the filter structure 26. By way of example, this may be a configuration that corresponds to the MEMS $20_2$. The backplate structure 22 may have one or more anti-sticking elements 84. By way of example, the membrane structure 18 and/or the filter structure 26 can be formed in the absence of anti-sticking elements.

FIG. 11 shows a schematic side sectional view of part of a MEMS 100 which, in relation to the MEMS 90, also has anti-sticking elements $84_2$ and $84_3$ on the membrane structure 18, said anti-sticking elements projecting into a region between the membrane structure 18 and the filter structure 26. In respect of the MEMS 90 and 100, the access opening of the housing may be arranged adjacent to the filter structure 26, for example. Alternative exemplary embodiments provide for the backplate structure 22 to be arranged between the membrane structure 18 and the filter structure 26. As an alternative or in addition thereto, it is conceivable for the filter structure 26 to be arranged in such a way that it is arranged on a side of the filter structure 22 facing away from the membrane structure 18. By way of example, the filter structure can be arranged at the top in the direction of the image and optionally have anti-sticking elements, for example.

Figure 12:
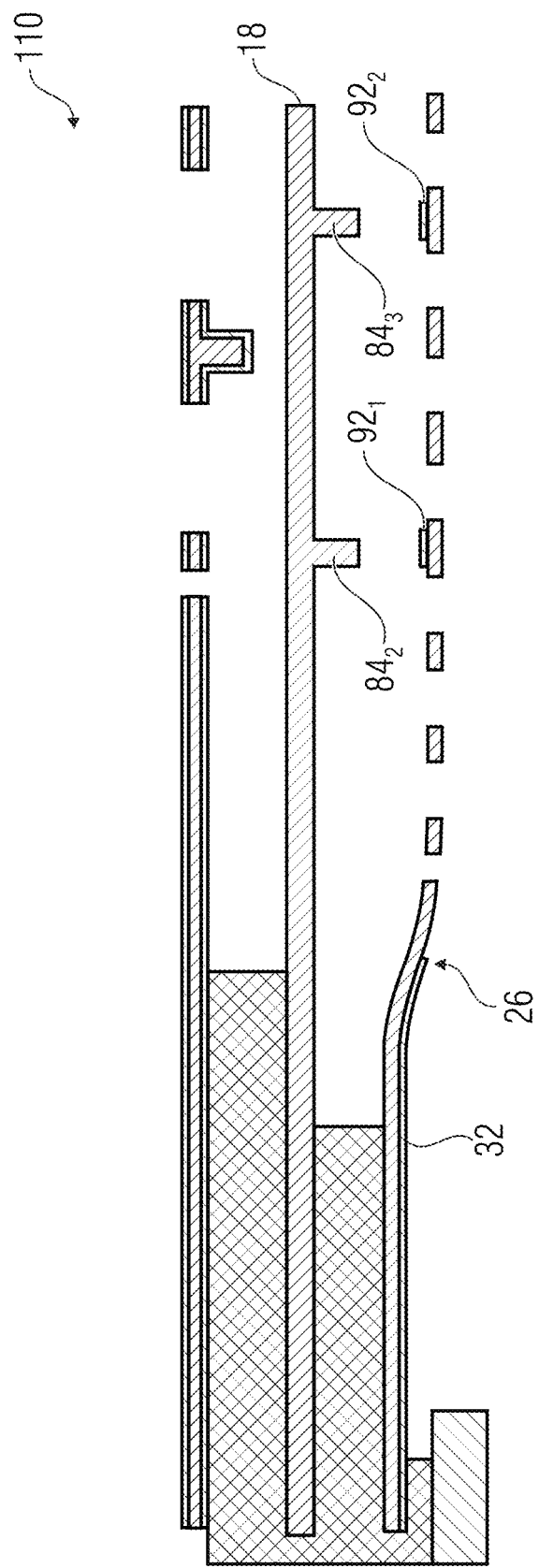
FIG. 12 shows a schematic side sectional view of a MEMS according to one exemplary embodiment, which is modified in relation to the MEMS of FIG. 11 to the effect of insulation elements being arranged on regions opposite to the anti-sticking elements.

FIG. 12 shows a schematic side sectional view of a MEMS 110 according to one exemplary embodiment, which is modified in relation to the MEMS too to the effect of insulation elements $92_1$ and $92_2$, which, for example, have the same or similar material to the pretension element 32, being arranged on the filter structure 26 in regions which may come into mechanical contact with the membrane structure 18, in particular with the anti-sticking elements $84_2$ and $84_3$ of same. This means that the insulation material of the insulation elements 92 may comprise a silicon nitride material. Likewise, as described in conjunction with the MEMS 70 for example, anti-sticking elements of the backplate structure 22b or of the membrane structure 18, for example, define contact regions of the filter structure 26, in which a mechanical contact with the backplate structure or the membrane structure can be implemented. The insulation material can be arranged at least in the contact regions, for example by way of insulation elements 92 or by way of coating the anti-sticking elements with a layer 52. The insulation elements 92 can also be understood to be a landing pad, which, overall, assume an area of at most 2% of the filter structure, at most 1.5% or at most 1% of the filter structure.

Figure 13B:
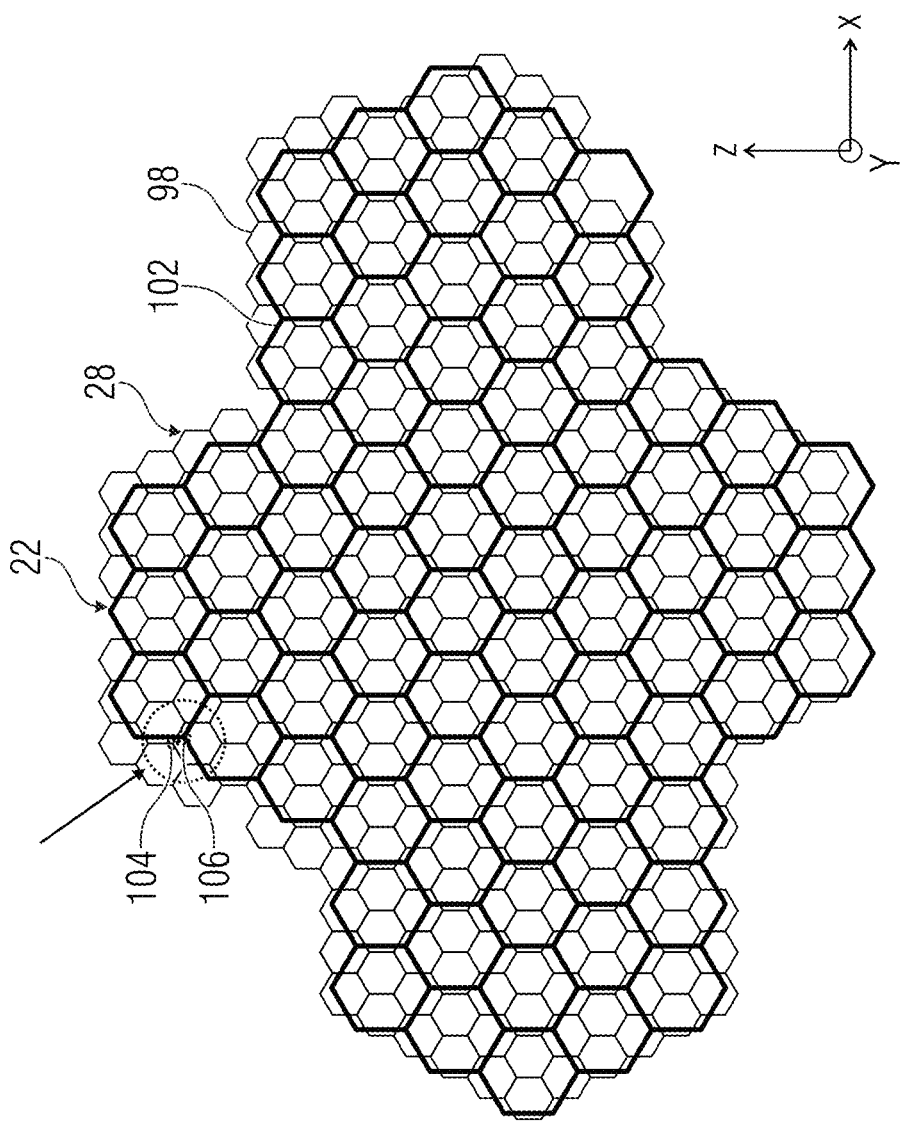
FIG. 13b shows a schematic plan view of an arrangement of the backplate structure and the filter structure of FIG. 13a, implemented lying on top of one another.
Figure 13A:
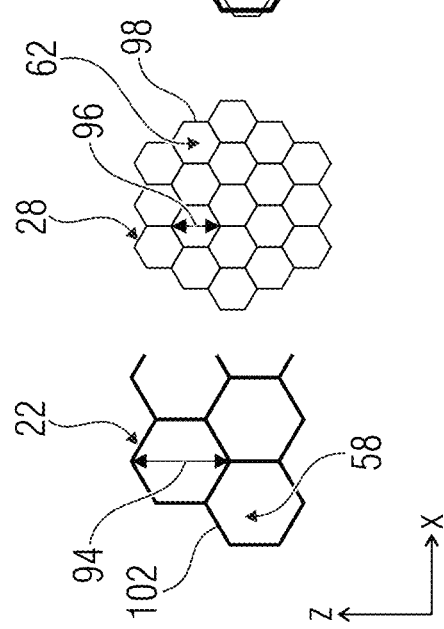
FIG. 13a shows a schematic illustration of a backplate structure and a filter structure according to one exemplary embodiment.
Figure 13C:
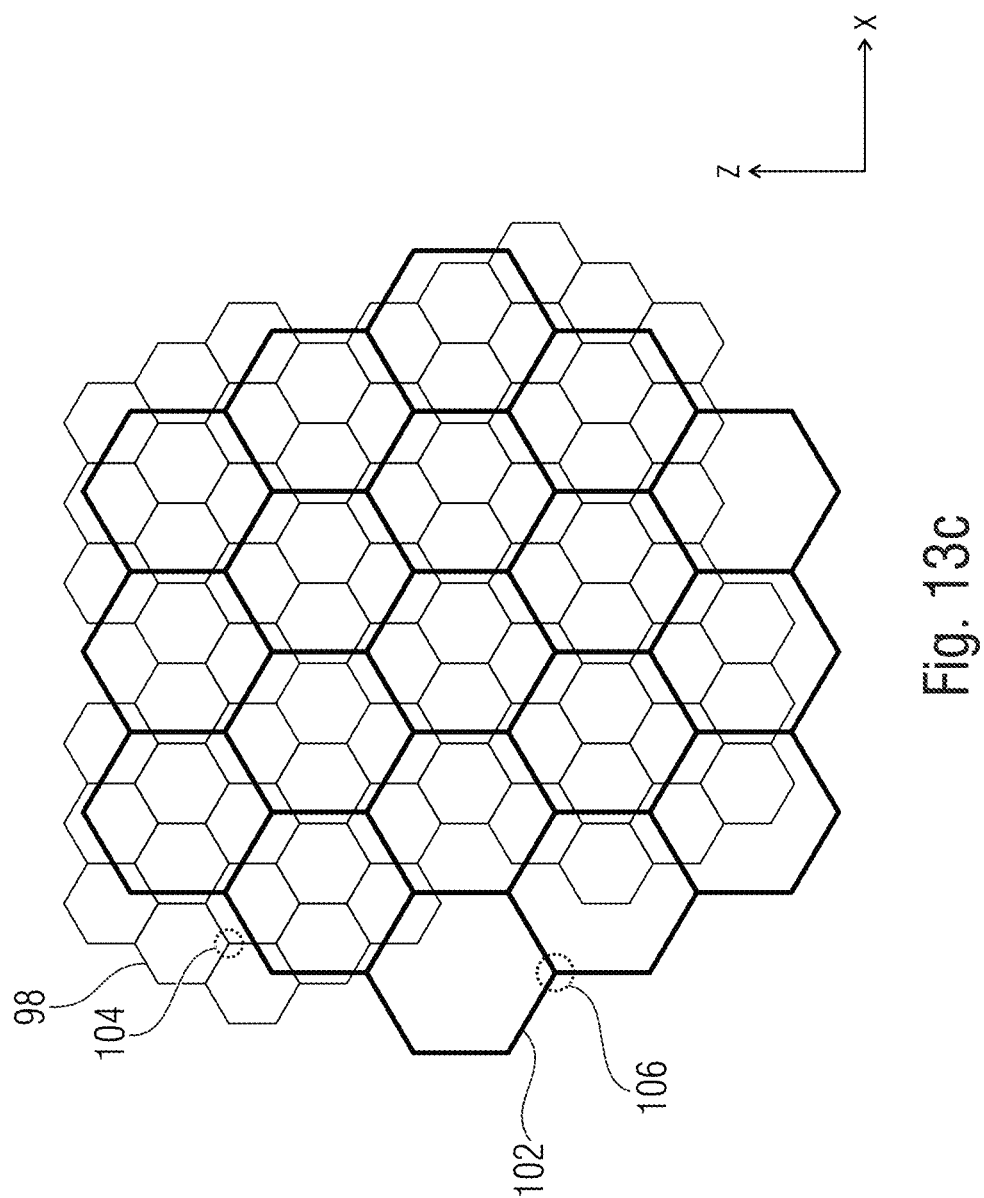
FIG. 13c shows a detailed view of the hole structure of the filter structure of FIG. 13b.

FIG. 13a is a schematic illustration of a backplate structure and of a filter structure according to one exemplary embodiment. The backplate structure 22 and the filter structure 28 can each be formed as a hole structure with a multiplicity of holes 62 and 58, respectively. According to one embodiment, the holes 62 and/or 58 can be formed as hexagons, with other forms, for example triangles, quadrilaterals, pentagons, heptagons or any other n-gons and/or irregular polygons, up to round or oval openings, also being implementable. Here, the holes 58 can have an opening 94 which, for example, determines a size that particles may have, said particles being able to pass the filter structure 28 if they are smaller than said size. Similarly, the holes 62 of the backplate structure 22 may have openings 96 or sizes of the holes 62 which determine a corresponding particle size up to which the particles are able to pass the backplate structure 22. Webs 98 can be arranged between adjacent holes 58, said webs being able to have an axial length of extent and a lateral extent that, in simplified fashion, can also be referred to as width. Here, the axial length of the web 98 can be selected in correspondence with the aperture 94. A web width of the webs 98 may adopt a value of at least 1 µm and at most 7 µm, at least 1.7 µm and at most 5 µm or at least 1.2 µm and at most 2 µm, for example 1.4 µm, in this case. The openings 94, which may also be understood to be filter holes, can be smaller in this case than the openings 62, which can also be understood to be backplate holes. According to one exemplary embodiment, the filter structure has an acoustic damping of sound transmitted or received through the access opening of at most 2 dB, at most 1.6 dB or at most 1.2 dB, for example 1.0 dB. Expressed differently, a backplate material of the backplate structure 22 may have the backplate holes 62, the dimensions 96 of which are greater than the dimensions 94 of the filter holes 58. Here, webs 102 of the backplate structure can have the same form as, or at least a similar form to, the webs 98 of the filter structure.

FIG. 13b shows a schematic plan view of an arrangement of the backplate structure 22 and of the filter structure 28, implemented lying on top of one another. According to one exemplary embodiment, the backplate structure 22 and/or the filter material 28 of the filter structure 26 are formed as a hole structure. The holes of the hole structures can have any geometry, for example, they can be elliptical, round, polygonal or according to a free-form surface. Even though the backplate structure 22 and the filter structure 26 are illustrated in such a way that they both have hexagonal holes, at least one of the two structures may differ therefrom. In addition to apertures that differ from one another, geometries of the backplate structure 22 and of the filter structure 26 that differ from one another may also be implemented.

By way of example, the backplate structure can be arranged proceeding from the filter structure 28 in a positive y-direction such that the fluid flow, which initially passes the filter structure 28 and subsequently reaches the backplate structure 22, is cleansed of particles that do not pass through the filter holes 58. In comparison with known backplate structures, this allows the backplate holes 62 to be larger and therefore have lower acoustic damping, which may counteract the compensation of apparent additional acoustic damping by the filter structure 28. By way of example, the opening 96 may have a value of at least 10 µm, at least 12 µm or at least 14 µm, or else be even larger. This facilitates backplate transparency, meaning that a surface area of the openings in relation to the overall area is at least 50%, at least 60% or even at least 70% or more.

According to one exemplary embodiment, the backplate structure 22 and the filter structure 28 are arranged offset from one another in such a way that both the webs 98 and their connection points and also the webs 102 and their connection points at best lie parallel or congruent to one another to a small extent in order to avoid a large-area contact in the case of a deflection of the backplate structure 22 and/or the filter structure 28 such that contact between the two structures occurs. To a large or complete extent, there is contact between the backplate structure 22 and the filter structure 28 in the region of the webs 98 and 102, while it is avoided in the region of the connection points or the crossing locations.

As described further on the basis of FIG. 3c, the webs 98 each have connection points 104, at which a respective number of webs 98, for example three webs, coincide. Similarly, the webs 102 may coincide at connection points 106. According to one exemplary embodiment, the filter structure 28 and the backplate structure 22 are now arranged offset from one another in such a way that, in the case of contact, at most 10%, at most 8% or at most 5% of the webs 104 present are arranged opposite to the connection points 106 and come into contact with one another.

According to one exemplary embodiment, none of the crossings and connection points 104 and 106 lie on top of one another in the case of contact. This allows anti-sticking elements to be dispensed with since it is already the case that only different webs cross one another as a result of the offset of the crossing points with respect to one another.

A dimension of the filter structure 28 along the y-direction can have, for example, a value of at least 0.5 µm and at most 5 µm, of at least 1 µm and at most 4 µm or of at least 1.5 µm and at most 2.5 µm, for example 2 µm. A dimension of the filter structure along the x-direction or the z-direction can, for example, lie in a region of at least 10 µm and at most 2000 µm, at least 100 µm and at most 1800 µm or at least 600 µm and at most 1500 µm, for example 700 µm; however, it may also have any other values and, in particular, higher values.

Figure 13D:
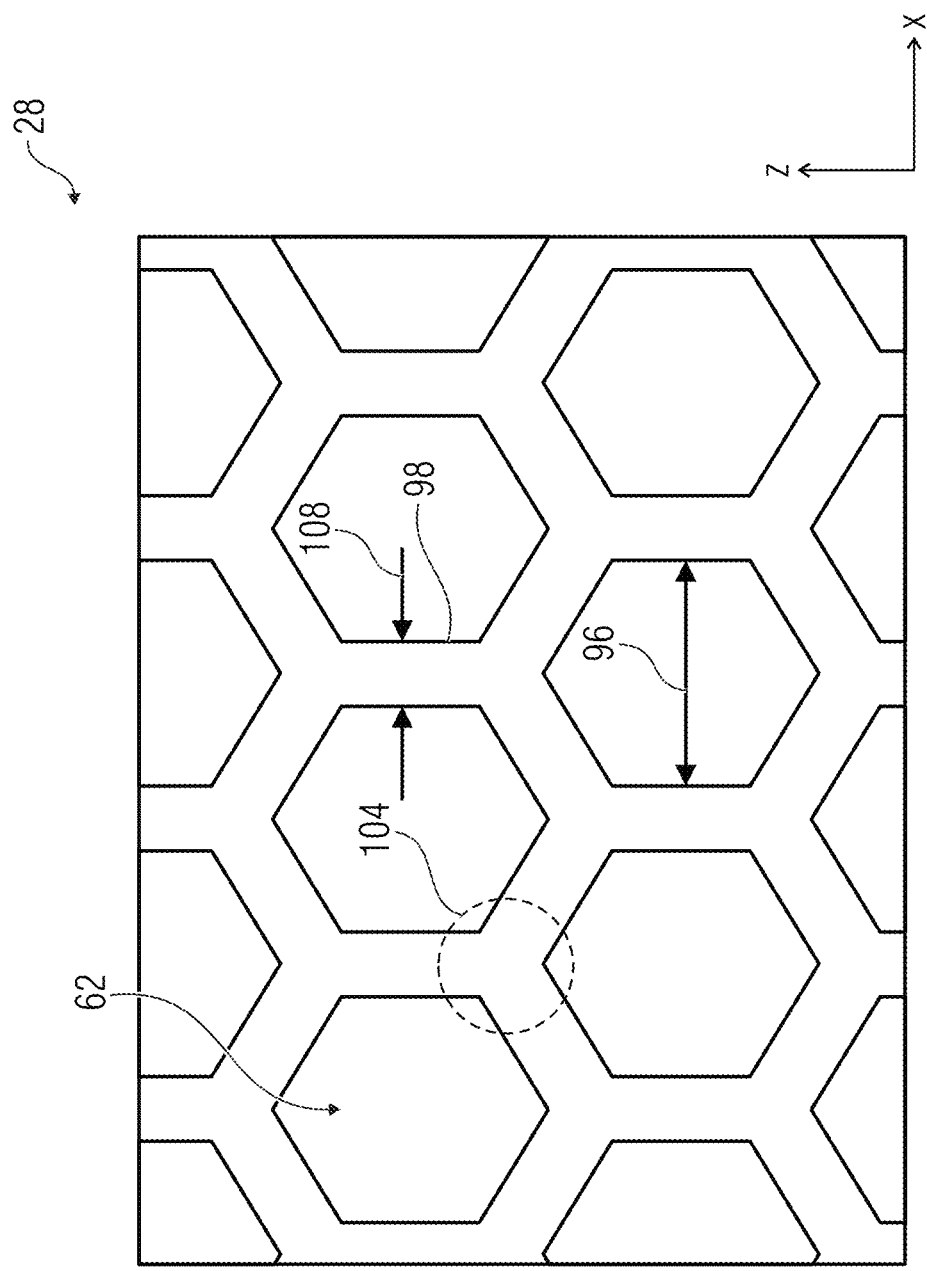
FIG. 13d shows a schematic plan view of a section of the filter material of FIG. 13b.

FIG. 13d shows a schematic plan view of a section of the filter material 28, which has openings 62 which may have the dimensions 96. The filter material 28 has the webs 98 with a lateral dimension, a web width 108, which may have the aforementioned values of at least 1 µm and at most 7 µm, at least 17 µm and at most 5 µm or at least 1.2 µm and at most 2 µm, for example 1.4 µm.

Figure 14A:
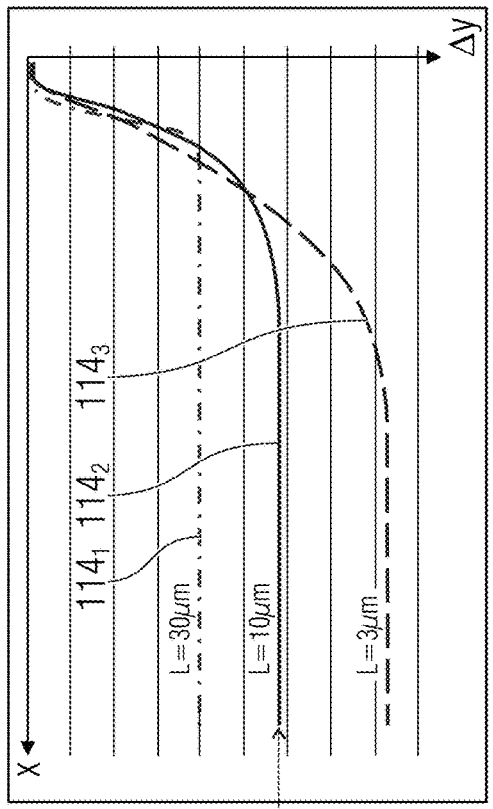
FIGS. 14a-14c show schematic curves of exemplary deflections of the filter material with different configurations of the production process according to exemplary embodiments.
Figure 14B:
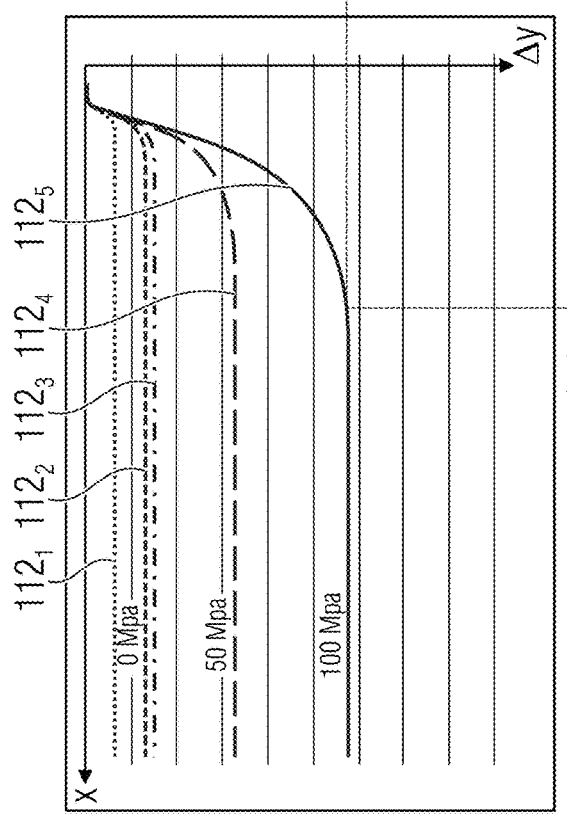
Figure 14C:
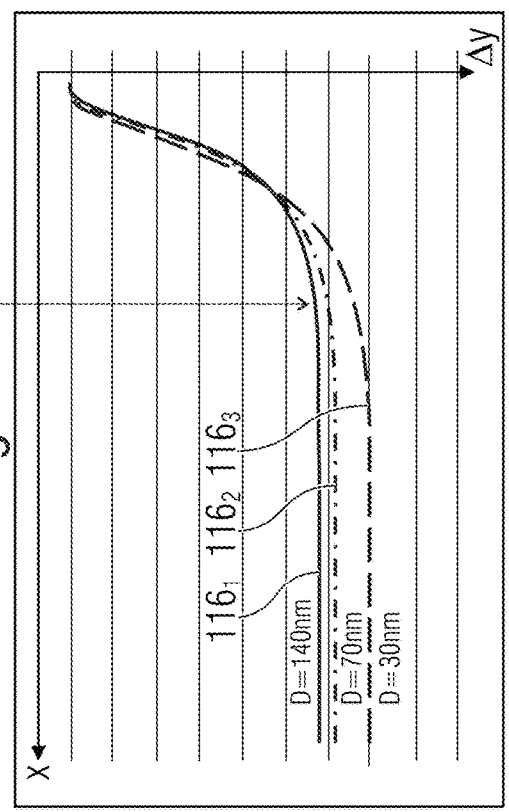

FIG. 14a to FIG. 14c show schematic curves of exemplary deflections of the filter material with different configurations of the production process and/or different configurations of the design of the pretension element. FIG. 14a shows influences of stress produced in the filter material. A curve $112_1$ shows a reference state in which a tensile stress is produced for example, meaning that the pretension element produces a tensile stress in the boundary layer between the pretension element and the filter material. The curves $112_2$, $112_3$, $112_4$ and $112_5$ show variations in the stress produced, with the curve $112_2$ producing a compressive stress of 0 MPa, the curve $112_3$ representing a low compressive stress of 10 MPa, for example, the curve $112_4$ representing a compressive stress of 500 MPa and the curve $112_5$ representing a compressive stress of 100 MPa. It is possible to identify that an increasing deflection of the filter structure can be obtained with increasing production of compressive stress in the filter material. Variations in further parameters are shown in FIG. 14b and FIG. 14c for the curve $112_5$. Thus, FIG. 14b shows a variation of a dimension L, which is also illustrated in FIG. 6, for example, and which specifies how far the pretension element 32 extends 28 toward a central region of the filter structure proceeding from an edge region of the filter structure 28, meaning a contraction of the pretension element starting from the edge. Curves $114_1$, $114_2$ and $114_3$ each show a variation in the deflection along the y-direction in the case of a change in the dimension L, wherein the curve $114_1$ may show a dimension L of 30 µm, for example, the curve $114_2$ may show a dimension L of 10 µm and the dimension $114_3$ of L equals 3 µm. It is possible to see that a decreasing deflection along the y-direction is obtained with increasing dimension L. Further, the bending curve can become steeper in the case of an increasing dimension L, which becomes clear, for example, from the almost kink-like profile of the curve $114_1$. Even though the curve $114_3$ can facilitate the greatest deflection along the y-direction, it may possibly be a small measure of force that is introduced into the filter material as a result of the small dimension L, which may lead to so-called soft deformation such that, under some operational conditions, there could be a back deformation of the filter structure by the operational conditions. Therefore, a compromise may comprise, for example, selecting a deflection lower than the maximum but, in exchange, obtaining a stable deflection therefor, wherein it is possible to avoid kinks in the curve profile at the same time, as may be facilitated by the dimension L=10 µm, for example.

In conjunction with the curve $112_5$, FIG. 14c shows a variation in a layer thickness of the pretension element along the y-direction. Curves $116_1$, $116_2$ and $116_3$ show variations in the deflection along the y-direction for different layer thicknesses of the pretension element along the y-direction in exemplary fashion, wherein the curve $116_1$ specifies a dimension D of 140 nm, the curve $116_2$ specifies a dimension D of 70 nm and the curve $116_3$ specifies a dimension/thickness D of 30 nm. It can be seen that an increasing deflection along the y-direction can be obtained with decreasing thickness of the pretension element. A low material thickness may provide little stiffness, while an increasing material thickness may offer additional stability, and so compromises are also found here.

The overall distance obtained between the structures can be selected here on the basis of the acoustic influence obtained, meaning a distance that is as small as possible and simultaneously exerts an acoustic influence that is just still acceptable. Building hereon, the dimensions of the filter structure can be selected in such a way that a robustness that is as high as possible and processing that it is as simple as possible are able to be obtained.

One aspect of the exemplary embodiments described herein comprises the concept of clearly deflecting the filter layer of the sensor in relation to the layer thickness of the insulation layer (layer 46) by a bimorph layer structure. This concept can be used for a multiplicity of semiconductor sensors. An increase or optimization of the filter effect can be obtained by a large distance of the filter layer from the sensor. By way of example, an increase in the thickness of the insulation layer between the filter layer and the sensor can be obtained to this end, e.g., of the layer $46_3$ in FIG. 6. As an alternative or in addition thereto, a great deflection of the filter layer can be used, for example by a bimorph layer structure between filter material and pretension element, in order to obtain deflections, meaning a distance 34, of 10 µm and more. The bimorph structure can use layer sequences with different stresses, for example a SiN/Si layer sequence, in which the SiN may have a tensile stress of approximately 1.2 GPa and Si may have approximately 100 MPa tensile stress to 100 MPa compressive stress.

The hole size in the filter layer can be reduced by arranging the additional filter structure opposite to the backplate structure; however, this may have additional influences on the acoustic behavior and hence on the sensor properties, for example a reduction in SNR. Although arranging the filter structure is accompanied by additional outlay for producing the sensor, for instance as a result of depositing the bimorph filter layer and structuring the latter, planarizing the surface after the filter layer structuring, depositing the insulation layer between the filter layer and the sensor layers, increasing the time for exposing the layers and/or producing anti-sticking elements for the filter layer, for instance on the lower side of the lower counter electrode, significant advantages are obtained as the particles can be kept away from the sound transducer device. Semiconductor-based materials, for example silicon, silicon oxide, silicon nitride and/or silicon oxynitride, lend themselves as materials for the filter material. By way of example, the filter layer is insulated from the lower counter electrode by SiN of the counter electrode in the case of double backplate configurations. Without the filter layer, the lower counter electrode acts as a particle filter during the production process. This requirement is dispensed with as a result of using the filter layer; therefore, by using the exemplary embodiments, the counter electrodes can be produced with a larger hole diameter and hence with a better signal-to-noise ratio. By way of example, an increase in the hole diameter from 7 μm to 10 μm can facilitate an SNR gain of +0.4 dB.

In some exemplary embodiments, a programmable logic element (e.g., a field-programmable gate array, FPGA) can be used to carry out some or all functionalities of the methods described herein. In some exemplary embodiments, a field-programmable gate array can interact with a microprocessor in order to carry out one of the methods described herein. In general, the methods are carried out on the basis of any hardware apparatus in some exemplary embodiments. Said hardware apparatus can be universally employable hardware, such as a computer processor (CPU) or hardware specific to the method, such as an ASIC, for example.

The exemplary embodiments described above only represent an elucidation of the principles of the present invention. It is understood that modifications and variations of the arrangements described herein and details are clear to other persons skilled in the art. Therefore, the intention is to restrict the invention only by the scope of protection of the subsequent patent claims and not by the specific details that were presented on the basis of the description and the explanation of the exemplary embodiments herein.

What is claimed is:

1. A microelectromechanical system comprising:
a housing having an access opening;
a sound transducer structure with a membrane structure and a backplate structure, wherein the sound transducer structure is coupled to the access opening; and
a filter structure arranged between the access opening and the sound transducer structure and which comprises a filter material and at least one pretension element, the latter being mechanically connected to the filter material, wherein the at least one pretension element is embodied to produce stress in the filter material in order to provide a bending deformation of the filter structure in a direction away from the backplate structure.

2. The microelectromechanical system as claimed in claim 1, wherein the filter structure is arranged between the access opening and the backplate structure.

3. The microelectromechanical system as claimed in claim 2, wherein the backplate structure is arranged between the membrane structure and the filter structure.

4. The microelectromechanical system as claimed in claim 1, wherein the filter material and a backplate material of the backplate structure are the same.

5. The microelectromechanical system as claimed in claim 1, wherein the filter material has filter holes with a first hole dimension and wherein a backplate material of the backplate structure has backplate holes with a second hole dimension, the second hole dimension being greater than the first hole dimension.

6. The microelectromechanical system as claimed in claim 1, wherein the filter structure comprises a first hole structure with a multiplicity of holes, which are spaced apart by a multiplicity of first webs, and wherein the backplate structure comprises a second hole structure with a multiplicity of second holes, which are spaced apart by a multiplicity of second webs, wherein the first hole structure and the second hole structure are opposite one another and arranged so that at most 10% of first connection points between first webs lie opposite one another, opposite to second connection points between second webs.

7. The microelectromechanical system as claimed in claim 1, wherein the filter structure comprises a hole structure with a multiplicity of holes, which are spaced apart by a multiplicity of webs, wherein a web width of the webs has a value of at least 1 μm and at most 7 μm.

8. The microelectromechanical system as claimed in claim 1, wherein the filter structure is mechanically impermeable to particles with a particle diameter of at least 6.5 μm.

9. The microelectromechanical system as claimed in claim 1, wherein the backplate structure has a first distance from the filter structure in the edge region of the backplate structure and a second distance in a central region, said second distance having a value of at least twice that of the first distance.

10. The microelectromechanical system as claimed in claim 1, wherein the backplate structure has a distance from the filter structure of at most 3 μm in the edge region of the backplate structure and a distance of at least 6 μm in a central region.

11. The microelectromechanical system as claimed in claim 1, wherein the backplate structure and the filter structure are securely clamped in an edge region and an insulation material is arranged between the backplate structure and the filter structure.

12. The microelectromechanical system as claimed in claim 11, wherein the filter structure is exposed by the isolator material to a greater extent in terms of area than the backplate structure.

13. The microelectromechanical system as claimed in claim 11, wherein the isolator material covers a side of the filter structure facing the backplate structure to a lesser extent in terms of area than a side facing away from the backplate structure.

14. The microelectromechanical system as claimed in claim 1, wherein the pretension element is arranged in a filter edge region of the filter structure.

15. The microelectromechanical system as claimed in claim 1, wherein the filter material comprises a polycrystalline silicon material and wherein the pretension element comprises a nitride material and is arranged on a side of the filter material facing away from the backplate structure.

16. The microelectromechanical system as claimed in claim 1, wherein the backplate structure or the filter structure comprises anti-sticking elements, which project into a region between the backplate structure and the filter structure.

17. The microelectromechanical system as claimed in claim 16, wherein the backplate structure comprises the anti-sticking elements, and wherein an insulation material is arranged on the filter structure in a region lying opposite to the anti-sticking elements.

18. The microelectromechanical system as claimed in claim 1, wherein the filter structure comprises a corrugation.

19. The microelectromechanical system as claimed in claim 1, wherein the backplate structure comprises a first backplate structure and a second backplate structure, wherein the membrane structure is arranged between the first backplate structure and the second backplate structure.

20. The microelectromechanical system as claimed in claim 1, wherein the filter structure comprises contact regions, said contact regions configured to come into contact with the backplate structure, and wherein an insulation material is arranged in the contact regions between the backplate structure and the filter structure.

21. The microelectromechanical system as claimed in claim 1, wherein the filter structure is configured to reduce a passage of particles and/or liquid to the backplate structure.

22. The microelectromechanical system as claimed in claim 1, configured as a microphone or loudspeaker.

23. The microelectromechanical system as claimed in claim 1, wherein the filter structure has an acoustic damping of at most 2 dB in respect of sound transmitted or received through the access opening.

* * * * *